United States Patent [19]

Murakami et al.

[11] Patent Number: 6,081,662
[45] Date of Patent: Jun. 27, 2000

[54] SEMICONDUCTOR DEVICE INCLUDING TRENCH ISOLATION STRUCTURE AND A METHOD OF MANUFACTURING THEREOF

[75] Inventors: Takaaki Murakami; Kenji Yasumura; Toshiyuki Oishi; Katsuomi Shiozawa, all of Hyogo, Japan

[73] Assignee: Mitsubishi Denki Kabushiki Kaisha, Tokyo, Japan

[21] Appl. No.: 08/937,187

[22] Filed: Sep. 29, 1997

Related U.S. Application Data

[62] Division of application No. 08/755,057, Nov. 22, 1996, abandoned.

[30] Foreign Application Priority Data

May 27, 1996 [JP] Japan .................................. 8-132205

[51] Int. Cl.[7] .................................................. G06F 17/50
[52] U.S. Cl. ............................. 395/500.35; 395/500.24; 395/500.25; 395/500.34; 257/391; 257/392; 257/219; 438/207; 438/218; 438/225
[58] Field of Search ....................... 395/500.35, 500.34, 395/500.25, 500.24; 438/224, 207, 218, 225; 257/391, 392, 219

[56] References Cited

U.S. PATENT DOCUMENTS

| | | | |
|---|---|---|---|
| 4,472,240 | 9/1984 | Kameyama | 257/510 |
| 5,164,805 | 11/1992 | Lee | 257/351 |
| 5,521,422 | 5/1996 | Mandelman et al. | 257/510 |
| 5,559,050 | 9/1996 | Alsmeier et al. | 438/276 |
| 5,604,581 | 2/1997 | Liu et al. | 356/73 |
| 5,744,372 | 4/1998 | Bulucea | 438/231 |
| 5,858,825 | 1/1999 | Alsmeier et al. | 438/224 |

FOREIGN PATENT DOCUMENTS 2-260660 10/1990 Japan .
2260660 10/1990 Japan .

OTHER PUBLICATIONS

Bhattacharya et al "Parametric Study of Latchup Immunity of Deep Trench–Isolated, Bulk, Nonepitaxial CMOS," IEEE, Apr. 1992, pp. 921–931.

"Optimized Shallow Trench Isolation Structure and its Process for Eliminating Shallow Trench Isolation–Induced Parasitic Effects," IBM Technical Disclosure Bulletin, vol. 34, No. 11, Apr. 1992, pp. 276–277.

R.C. Vankemmel, et al. "A Study of the Corner Effect in Trench–Like Isolated Structures," IEEE Transactions on Electron Devices, vol. 37, No. 1, Jan. 1990, pp. 168–176.

Steve Shao–Shiun Chung, "An Analytical Threshold–Voltage Model of Trench–Isolated MOS Devices with Nonuniformity Doped Substrates", *IEEE Transactions on Electron Device*, vol. 39, No. 3, Mar. 1992, pp. 614–622.

Andres Bryant, et al: "Characteristics of CMOS Device Isolation for the ULSI Age", *IEDM* 1994, pp. 671–674.

*Primary Examiner*—Kevin J. Teska
*Assistant Examiner*—Vuthe Siek
*Attorney, Agent, or Firm*—McDermott, Will & Emery

[57] ABSTRACT

In a trench isolation structure having active regions at a main surface of a silicon substrate isolated by providing a gate electrode on an insulation film formed in a trench with a gate oxide film thereunder, the insulation film has a vertical cross section configuration wherein the carrier concentration of the active region at the proximity of the upper edge corner of the trench becomes lower than the carrier concentration at the center of the active region in a state where a predetermined bias voltage is applied to the gate electrode. According to this structure, electric field concentration at the edge of the trench isolation can be relaxed and generation of an inverse narrow channel effect suppressed. Therefore, the subthreshold characteristics can be improved.

9 Claims, 23 Drawing Sheets

SEMICONDUCTOR DEVICE INCLUDING TRENCH ISOLATION STRUCTURE AND A METHOD OF MANUFACTURING THEREOF

This application is a divisional of application Ser. No. 08/755,057 filed Nov. 22, 1996, abandoned.

BACKGROUND OF THE INVENTION

1. Field of the Invention

The present invention relates to a structure and manufacturing method of a semiconductor device including a trench isolation structure for providing isolation between active device formation regions (referred to "active region" hereinafter) formed at the main surface of a semiconductor substrate. Particularly, the present invention relates to a structure and a manufacturing method of a semiconductor device including a trench isolation structure suitable for preventing generation of an inverse narrow channel effect when applied in a VLSI (Very Large Scale Integrated circuit).

2. Description of the Background Art

As a conventional element isolation technique in a VLSI, a trench isolation structure is employed that isolates active regions on a main surface of a semiconductor substrate by burying an insulation film into a trench provided at the main surface. The method of manufacturing a conventional trench isolation structure disclosed in pp. 28.1.1~28.1.4 in IEDM 94-671 will be described hereinafter with reference to FIGS. 28A–28C and FIGS. 29A–29C.

In this conventional method of manufacturing a trench isolation structure shown in FIG. 28A, a thermal oxide film 2, a silicon nitride film 3, and an oxide film 4 are formed in a stacked manner on a silicon substrate 1. Then, an opening 5 is formed in these layered films at a position corresponding to an isolation region where a trench is to be formed. Formation of opening 5 is effected by a patterning process according to photolithography, dry etching, and the like.

Using this pattern including opening 5 as a mask, silicon substrate 1 is selectively etched to form a trench 6 where an isolation region is to be provided as shown in FIG. 28B. Then, thermal oxidation is applied to form a thermal oxide film 7 at the inner wall of trench 6 (FIG. 28B). Then, as shown in FIG. 28C, trench 6 is filled with an oxide film 8 by TEOS (Tetra Ethyl Ortho Silicate glass) method. Since the aspect ratio of trench 6 prior to the formation of oxide film 8 is high in the current integrated circuits scaled to higher densities, trench 6 must be filled with an oxide film that is not dense such as a TEOS oxide film in order to avoid the generation of a void. Then, as shown in FIG. 29A, planarization is carried out by means of etching, mechanical abrasion, or chemical abrasion with silicon nitride film 3 as a stopper. FIG. 29B shows the structure where silicon nitride film 3 exposed by the planarization process is removed. Then, thermal oxide film 2 is removed by wet etching, and oxide film 8 is planarized. Then, a gate oxide film 9 is formed on silicon substrate 1. A gate electrode is formed thereupon to result in the structure shown in FIG. 29C.

In a MOS (Metal Oxide Semiconductor) transistor, the so called narrow channel effect where the threshold voltage increases according to reduction of the channel width is generally encountered. In a trench isolation structure, an electric field is concentrated in the proximity of the edge of the trench isolation (around point A shown in FIG. 29C) when a voltage of the level of approximately the threshold value is applied to the gate electrode, whereby a parasitic channel is formed in the proximity of the trench isolation edge. Current will flow through the parasitic channel formed at the sidewall of the trench to result in a lower threshold voltage. This phenomenon where the threshold voltage is reduced as the channel width becomes smaller is called an inverse narrow channel effect. This inverse narrow channel effect is also called "hump phenomenon" from the fact that a hump is generated in the drain current of the subthreshold characteristics.

This inverse narrow channel effect has becomes a significant problem in a semiconductor device including a trench isolation structure since it causes variation in the threshold voltage, which in turn induces degradation of the subthreshold characteristics.

SUMMARY OF THE INVENTION

An object of the present invention is to provide a semiconductor device and a manufacturing method thereof including a trench isolation structure that can have generation of an inverse narrow channel effect suppressed by optimizing the configuration of the upper corner portion of a trench and the protruding configuration of an insulation film buried in the trench.

A semiconductor device including a trench isolation structure according to the present invention has active regions isolated by burying an insulation film in a trench formed having a predetermined depth from a main surface of the semiconductor substrate so as to extend along the boundary between active regions at the main surface of the semiconductor substrate. A gate electrode is formed on the insulation film so as to extend in a direction crossing the formation direction of the trench with a gate oxide film thereunder. The insulation film has a vertical cross section right under the gate electrode in the direction of extension thereof so that the carrier concentration of the active region in the proximity of the upper edge corner of the trench is lower than the carrier concentration at the middle of the active region while a predetermined bias voltage is applied to the gate electrode.

Since the carrier concentration of the active region at the proximity of the upper corner of the trench becomes lower than that of the middle portion of the active region while a predetermined bias voltage is applied to the gate electrode in the structure of the present invention, electric field concentration at the proximity of the trench isolation edge is relaxed. As a result, generation of an inverse narrow channel effect is suppressed. Therefore, variation in the threshold voltage is suppressed to allow improvement of the subthreshold characteristics.

Various specific examples are provided in the following as a configuration of a trench isolation structure satisfying the above conditions. As a first example, a recess is formed in the proximity of respective edges of the trench at the upper surface of the insulation film buried in the trench. Formation is effected so as to satisfy the conditions of:

$$x \geq 45.8d^3 - 11.9d^2 + 1.0d + 0.01$$

$$x > 0, d > 0$$

where d is the depth of each recess on the basis of the level of the planarized portion of top surface of the gate oxide film with no recess, and x is the shortest distance between the gate electrode formed on the recess at each edge and the sidewall of the trench.

The recess is eventually formed during the etchback step in forming the insulation film that fills the trench. By controlling the condition of the etchback step, a recess of a configuration satisfying the above conditions can be formed relatively easily.

In a second example of forming a trench isolation configuration, the insulation film buried in the trench is formed so as to have a protruding portion projecting upwards from the main surface of the semiconductor substrate. The projection is formed so as to have a tapered configuration in which the distance between the sidewalls facing each other becomes smaller in the upward direction, a configuration in which opposite sidewalls are perpendicular to the main surface of the semiconductor substrate, or a vertical cross section of a round configuration right under the gate electrode in an extending direction thereof.

As a third example of the trench isolation configuration, the upper corner edge of the trench has a chamfered tapering configuration with a lateral width of at least 0.05 $\mu$m and a depth of not more than 0.05 $\mu$m, or a R configuration with a radius of curvature of at least 0.04 $\mu$m. When the upper edge corner portion of the trench has such a configuration, the above condition that "the carrier concentration of the active region at the end portion side of the trench is lower than the carrier concentration at the middle of the active region while a predetermined bias voltage is applied to the gate electrode" is satisfied regardless of whether there is projection of an insulation film buried in the trench at the main surface of the semiconductor substrate. Therefore, this trench isolation configuration is also applicable to a structure where the insulation film buried in the trench has a top surface substantially in flush with the main surface of the semiconductor substrate. By employing this structure, the object of the present invention can be achieved without increase in the stepped portion of the surface.

A method of manufacturing a semiconductor device including a trench isolation structure of the present invention includes the steps of forming a mask having an opening corresponding to a trench to be formed of at least 160 nm and not more than 380 nm in thickness on an active region formed at a main surface of a semiconductor substrate, forming a trench selectively of at least 0.15 $\mu$m and not more than 0.3 $\mu$m in depth in the semiconductor substrate by etching the semiconductor substrate using the mask, forming a thermal oxide film of at least 10 nm and not more than 50 nm in film thickness at an inner wall of the trench by subjecting the inner wall to thermal oxidation, filling the trench having a thermal oxide film at the inner wall with an insulation film and covering the mask with the insulating film, selectively removing the insulation film so as to leave only the portion filling the trench and in the opening of the mask, removing the mask, and forming a gate electrode on the insulation film with a gate oxide film therebetween. A trench isolation edge structure is formed so that the carrier concentration of the active region in the proximity of the upper edge corner of the trench becomes lower than the carrier concentration of the active region at the middle portion thereof.

According to the above process, the electric field concentration at the edge of the trench can be relaxed. As a result, a trench isolation structure can be formed efficiently having the generation of inverse narrow channel effect suppressed.

The method of manufacturing a semiconductor device including a trench isolation structure of the present invention specifically employs various steps set forth in the following. As the first example, the step of forming a mask includes the step of layering a silicon oxide film and a silicon nitride film sequentially. A silicon oxide film is employed as the insulation film filling the trench. The step forming a mask can be implemented by sequentially layering a silicon oxide film of at least 10 nm and not more than 30 nm in thickness, a silicon nitride film of at least 100 nm and not more than 200 nm in thickness, and a silicon oxide film of at least 50 nm and not more than 150 nm in thickness.

In the method of manufacturing a semiconductor device including a trench isolation structure of the present invention, the distance between the opposite corners at the upper edge of the trench can be controlled by adjusting the film pressure of the thermal oxide film in forming a thermal oxide film selectively at an inner wall of the trench by thermal oxidation. As an alternative method, the distance between opposite corners at the upper edge of the trench can be controlled by, after forming the trench, and before selectively forming a thermal oxide film at the inner wall of the trench by thermal oxidation, forming a sacrifice oxide film at the inner surface of the trench by thermal oxidation, and selectively removing the sacrifice oxide film by etching to adjust the film pressure of the sacrifice oxide film.

According to the manufacturing method of the present invention, the step of forming a mask includes the step of forming a silicon oxide film, a silicon film, a silicon nitride film and a silicon oxide film sequentially in a layered manner. In the step of forming a thermal oxide film at the inner wall of the trench, the portion of the silicon film in the proximity of the corner portion at the upper edge of the trench is simultaneously subjected to thermal oxidation to convert this portion into a silicon oxide film, whereby the portion of the insulation film protruding from the main surface of the semiconductor substrate can be formed having a tapering configuration.

The thermal oxidation in the step of forming a thermal oxide film at the inner wall of the trench is preferably carried out under a formation temperature higher than 100° C. and/or under a pressure higher than at least 1 atmospheric pressure.

According to the manufacturing method of the present invention, the insulation film can be formed to have a round configuration or a tapered configuration by, after the step of removing the mask and before the step of forming a gate electrode, depositing an insulation film all over, and etching back the insulation film to leave a sidewall insulation film having a maximum width of at least 10 nm and not more than 60 nm at both side portions of the insulation film protruding from the main surface of the semiconductor substrate.

Also, the step of forming a trench can include a first etching step of etching the semiconductor substrate for at least 10 nm and not more than 50 nm in depth isotropically, and a second etching step of selectively etching the semiconductor substrate for at least 0.15 $\mu$m and not more than 0.3 $\mu$m in depth anisotropically, whereby a trench having a tapered configuration at the upper edge corner is formed.

Determination of the specification of the trench isolation structure in implementing the method of manufacturing a semiconductor device including a trench isolation structure of the present invention is made by setting the configuration parameters of the trench isolation edge structure so that the carrier concentration at the middle of the active region is higher than the carrier concentration of the active region at the end portion of the trench according to simulation expressing the carrier concentration of the active region at the middle and the carrier concentration of the active region at the edge portion side of the trench with an equation of a regression curve using the configuration parameters of the trench isolation edge structure.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIGS. 17A–17C shows a structure of the present invention having a plurality of recesses formed at the upper portion of the insulation film filling the trench, wherein FIG. 17A is a sectional view where the top surface of the insulation film is substantially in flush with the main surface of the silicon substrate, and FIGS. 17B and 17C are sectional views where the entire top surface of the insulation film is lower than the main surface of the silicon substrate.

DESCRIPTION OF THE PREFERRED EMBODIMENTS

First, a carrier concentration analysis by means of simulation will be described as a method of identifying a preferable embodiment applying the basic technical concept of the present invention.

As described in the article of "IEEE Transactions on Electron Devices", vol. 39, No. 3, March 1992 in page 614, an inverse narrow channel effect (or hump phenomenon) occurs by the fact that an inversion layer is more easily formed in the proximity of the edge of an active region (referred to as "isolation edge" hereinafter) at the side of an isolation oxide film isolating that active region from another active region than at the center portion of the active region. Therefore, it is possible to estimate the level of the inverse narrow channel effect quantatively according to the difference between respective carrier concentrations of the active region in the center portion and in the proximity of the isolation edge by analyzing the carrier concentration of the inversion layer by simulation. A procedure of analyzing the inverse narrow channel effect by simulation will be described hereinafter when a trench isolation structure is provided at a p well formed at a main surface of the semiconductor substrate.

First, a model of a device structure to be analyzed is generated using a process simulation. Next, the electron concentration with a bias applied is obtained by the device simulation using the model of the device structure. Then, the difference in electron concentration between the center portion and the portion in the proximity of the isolation edge of the active region is calculated from the obtained data of electron concentration to plot against the parameters of a cross section configuration of the trench. It is possible to determine whether an inverse narrow channel effect occurs or not depending upon the positive/negative value of this electron concentration difference. In this case, determination is made that an inverse narrow channel effect and a narrow channel effect occur when ΔE defined by:

(electron concentration difference:ΔE)=(electron concentration of active region near isolation edge)—(electron concentration of center portion of active region) is positive and negative, respectively.

When a trench isolation structure is formed at an n well formed at a main surface of the semiconductor substrate, a similar analysis is carried out for the concentration of holes.

More specifically, determination is made that an inverse narrow channel effect and a narrow channel effect occur when the difference in the hole concentration defined by:

(hole concentration difference)=(hole concentration of active region near isolation edge)−(hole concentration of center portion of active region) is positive and negative, respectively.

Figure 1:
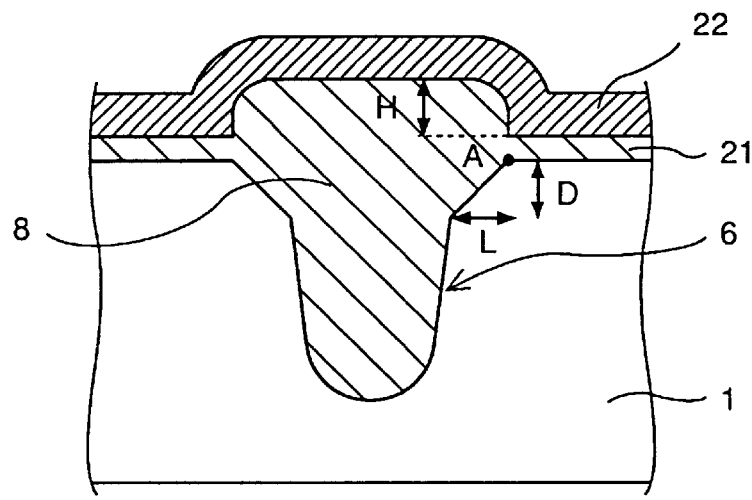
FIG. 1 is a sectional view of a trench isolation structure according to an embodiment of the present invention.
Figure 30A:
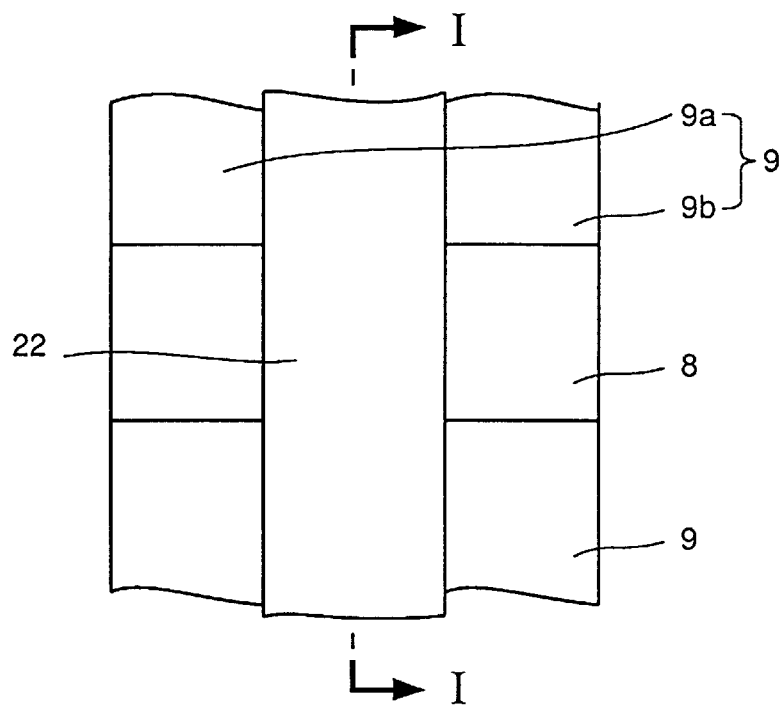
FIG. 30A is a plan view of the trench isolation structure shown in FIG. 1.
Figure 30B:
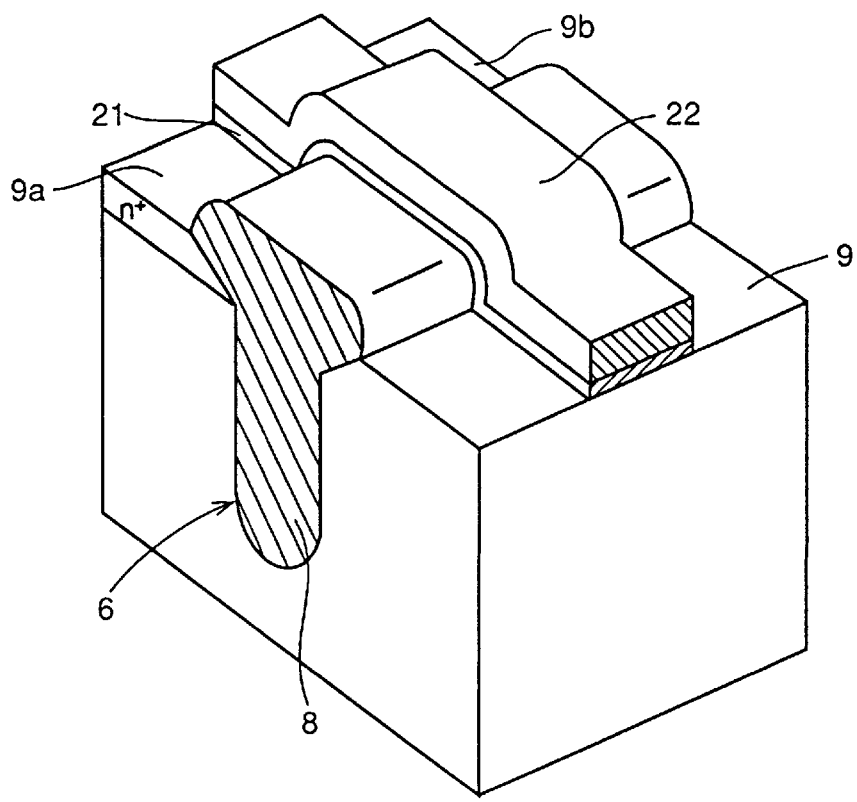
FIG. 30B is a partial cross sectional perspective view of the same structure, wherein the cross section of line I—I corresponds to the cross section shown in FIG. 1.

Then, this analysis is implemented for each parameter of the trench isolation edge formation shown in FIG. 1. FIGS. 30A and 30B show a plan view and a partial cross sectional perspective view of the structure of FIG. 1. FIG. 1 is a cross section taken along line I—I of FIG. 30A. According to this structure, active regions 9, 9 on the main surface of silicon substrate 1 are isolated by trench 6 and insulation film 8 filling trench 6. A gate electrode 22 is formed over active regions 9, 9 and insulation film 8 with a gate oxide film 21 thereunder. Gate electrode 22 is formed to extend in a direction substantially at right angles to the formation direction of trench 6, i.e. along the boundary between active regions 9, 9. A source region 9a and a drain region 9b doped with n type impurities are formed at both sides of gate electrode 22 in at least one of active regions 6 and 6 sandwiching trench 6.

Figure 2:
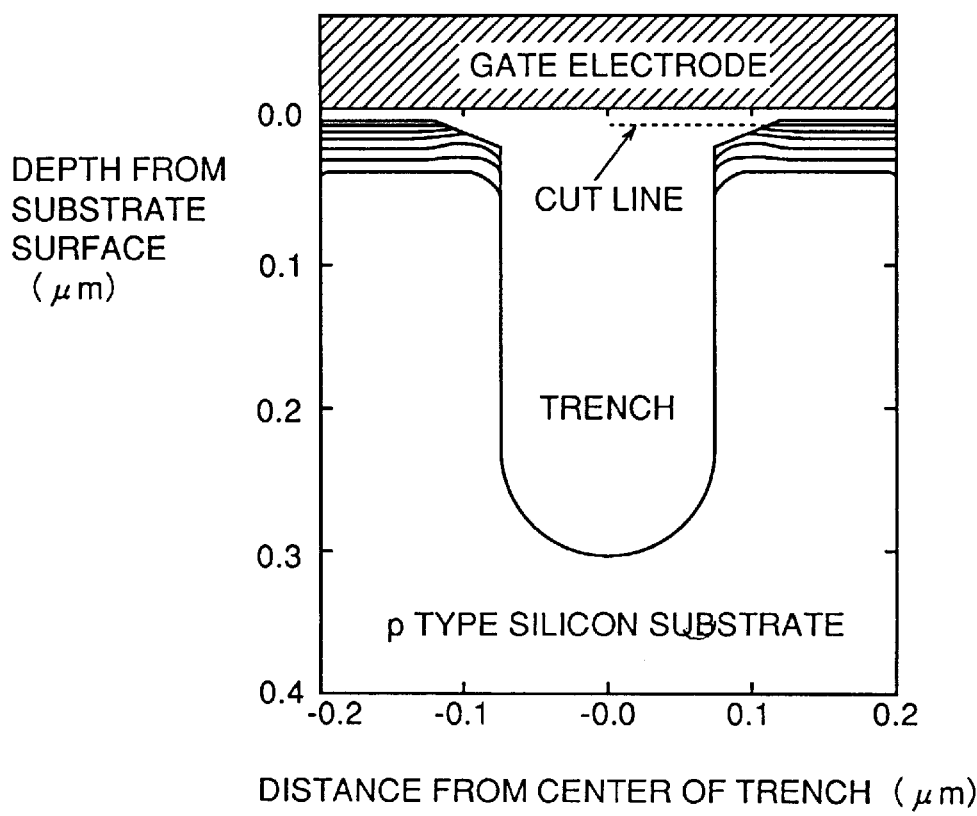
FIG. 2 shows the two-dimensional electron concentration analysis result in the trench isolation structure of the present invention when parameter D shown in FIG. 1 is 0.02 $\mu$m and the bias voltage Vg applied to the gate electrode is 0.5V.
Figure 3:
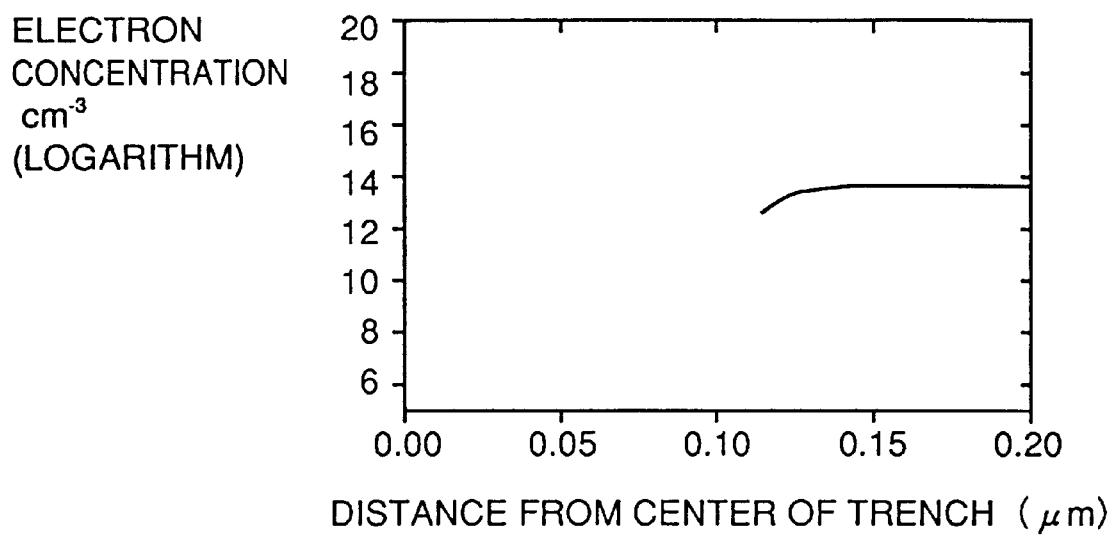
FIG. 3 shows a one-dimensional electron concentration distribution taken along the cut line in the analysis result of FIG. 2.
Figure 4:
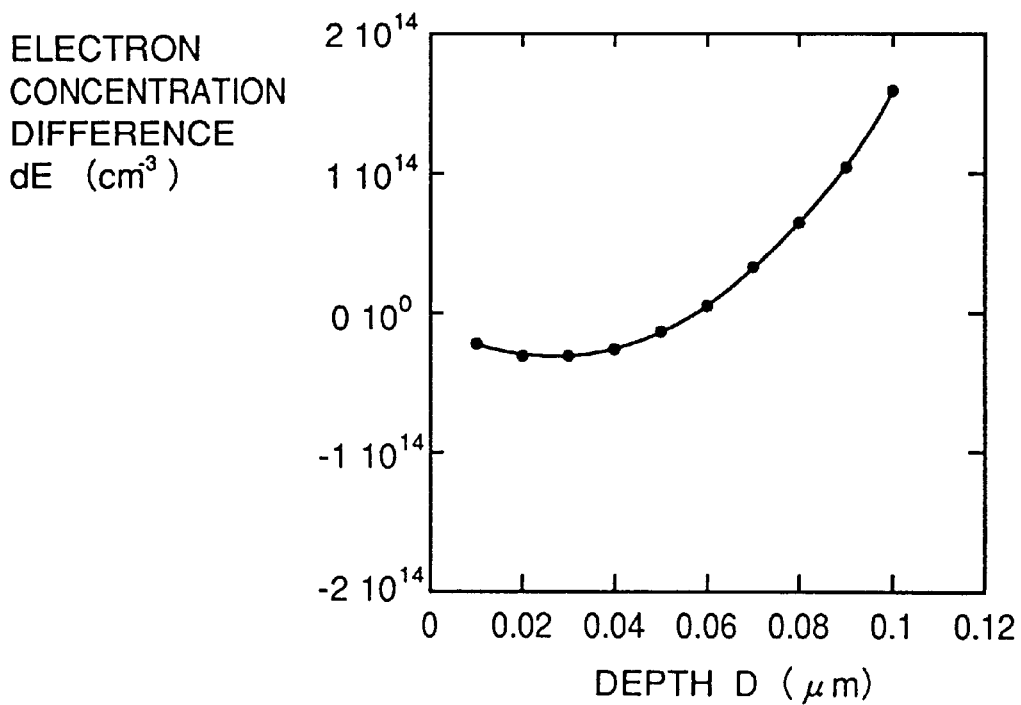
FIG. 4 shows the dependency of the electron concentration difference $\Delta E$ between both edges of the one-dimensional plot of FIG. 3 on the trench edge step D.

This analysis can be described as set forth in the following taking depth L as an example among the parameters of the edge configuration of the trench. First, an analysis structure is generated with a process simulation. The region of analysis is −0.2~0.2 μm in an X direction and up to 2.0 μm from the surface of the silicon substrate in the Y direction centering about the trench. The analysis was carried out with a trench of 0.3 μm in depth, a gate oxide film of 6 nm in thickness, and an upper electrode of polysilicon planarized by 0.15 μm. Parameter L is 0.05 μm and depth D is varied within the range of 0.01~0.10 μm for the trench edge configuration. In the device simulation, a gate electrode formed of polycrystalline at the upper portion and the lower end of the analysis region are adapted as electrodes. A bias of 0.5V is applied to the gate electrode. The lower electrode is set to 0V. FIG. 2 indicates the result of the two-dimensional electron concentration analysis when D=0.02 μm (gate electrode potential Vg=0.5V). FIG. 3 shows the one-dimensional electron concentration taken along the cut line shown in FIG. 2. The difference of the electron concentration between both ends of this one-dimensional plot is defined as ΔE. The dependency of this electron concentration difference ΔE on trench edge step D is shown in FIG. 4. It is appreciated that the electron concentration of the active region in the proximity of the isolation edge is higher than that of the center portion of the active region when D≧0.06 μm. In other words, it is appreciated that an inverse narrow channel effect is generated.

Similar analysis is carried out for length L and height H to obtain the total electron concentration difference ΔE with a combination of the parameter sets of D, L, and H that can be varied independently. The dependency of ΔE on each parameter for carrying out this analysis efficiently is represented by the following three regression curves.

$$\Delta E(D)=d_5D^5+d_4D^4+d_3D^3+d_2D^2+d_1D+d_0 (0.0 \leq D \leq 0.1 \ \mu m)$$

$$d_5=-2.10\times10^{19}$$

$$d_4=5.95\times10^{18}$$

$$d_3=-5.74\times10^{17}$$

$$d_2=5.67\times10^{16}$$

$$d_1=-2.09\times10^{15} \quad \text{[Equation 1]}$$

$$\Delta E(L)=l_5L^5+l_4L^4+l_3L^3+l_2L^2+l_1L+l_0 (0 \leq L \leq 0.05 \ \mu m)$$

$$l_5=-3.16\times10^{23}$$

$$l_4=4.99\times10^{22}$$

$$l_3=-3.07\times10^{21}$$

$$l_2=9.25\times10^{19}$$

$$l_1=-1.40\times10^{18}$$

$$l_0=8.91\times10^{15} \quad \text{[Equation 2]}$$

$$\Delta E(H)=h_4H^4+h_3H^3+h_2H^2+h_1H+h_0 (0.0 \leq H \leq 0.1 \ \mu m)$$

$$h_4=4.32\times10^{18}$$

$$h_3=-9.30\times10^{17}$$

$$h_2=6.49\times10^{16}$$

$$H_1=-1.23\times10^{15}$$

$$h_0=-2.56\times10^{13} \quad \text{[Equation 3]}$$

The trench edge configuration is determined so that the total of the regression curve equations with respect to the parameter set of (D, L, H) that can be varied independently takes a negative value.

More specifically, the values of respective parameters are determined so as to satisfy:

$$\Delta E(D)+\Delta E(L)+\Delta E(H) \leq 0 \quad \text{[Equation 4]}$$

Figure 5:
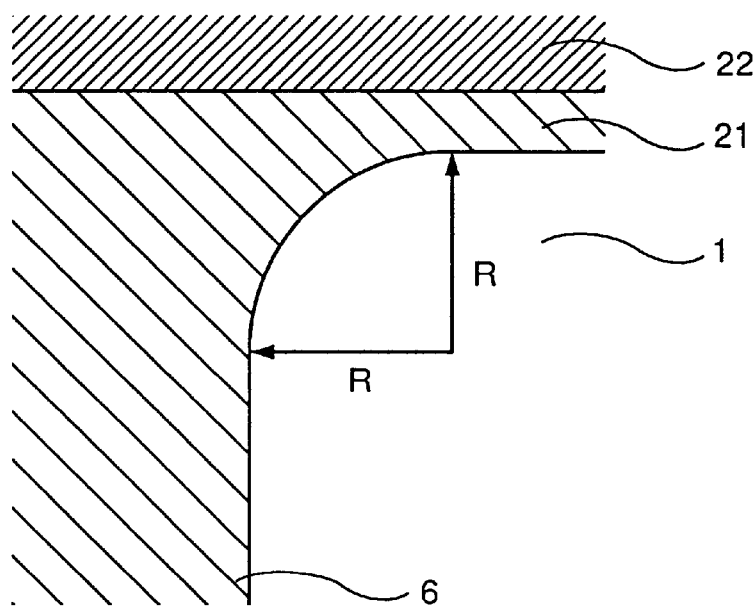
FIG. 5 shows the definition of the radius of curvature R of the edge of the trench in the analysis structure of the present invention.
Figure 6:
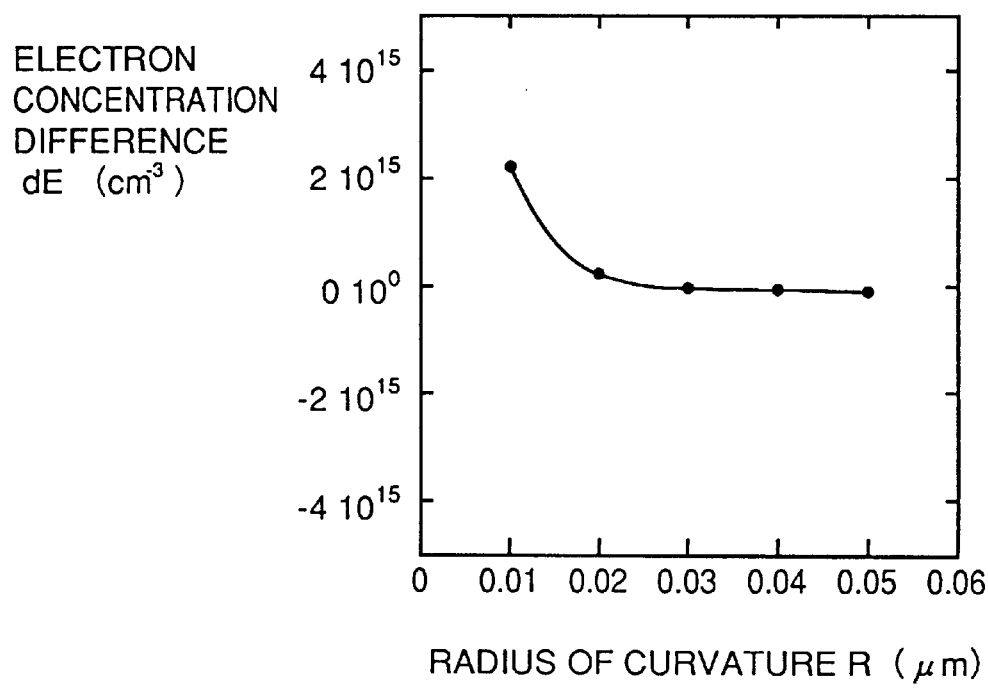
FIG. 6 shows the dependency of electron concentration difference $\Delta E$ on radius of curvature R when Vg is 0.5V.

Next, a similar analysis is carried out for a radius of curvature R of the edge of the trench. The radius of curvature R of the trench edge used for analysis is 0.01~0.05 μm. The definition of the radius of curvature R in the analysis structure is shown in FIG. 5. The dependency of electron concentration difference ΔE on the radius of curvature when Vg=0.5V is shown in FIG. 6. The equation of the regression curve obtained from the result is:

$$\Delta E(R)=r_4R^4+r_3R^3+r_2R^2+r_1R+r_0 (0.01 \leq R \leq 0.05 \ \mu m)$$

$r_4=5.56\times10^{21}$ $r_3=-8.07\times10^{20}$ $r_2=4.31\times10^{19}$ $r_1=-1.00\times10^{18}$ $r_0=8.73\times10^{15}$ [Equation 5]

Therefore, $\Delta E \leq 0$ with radius of curvature $R \geq 0.036 \ \mu m$ when the upper electrode is planarized, so that an inverse narrow channel effect can be suppressed.

Figure 7:
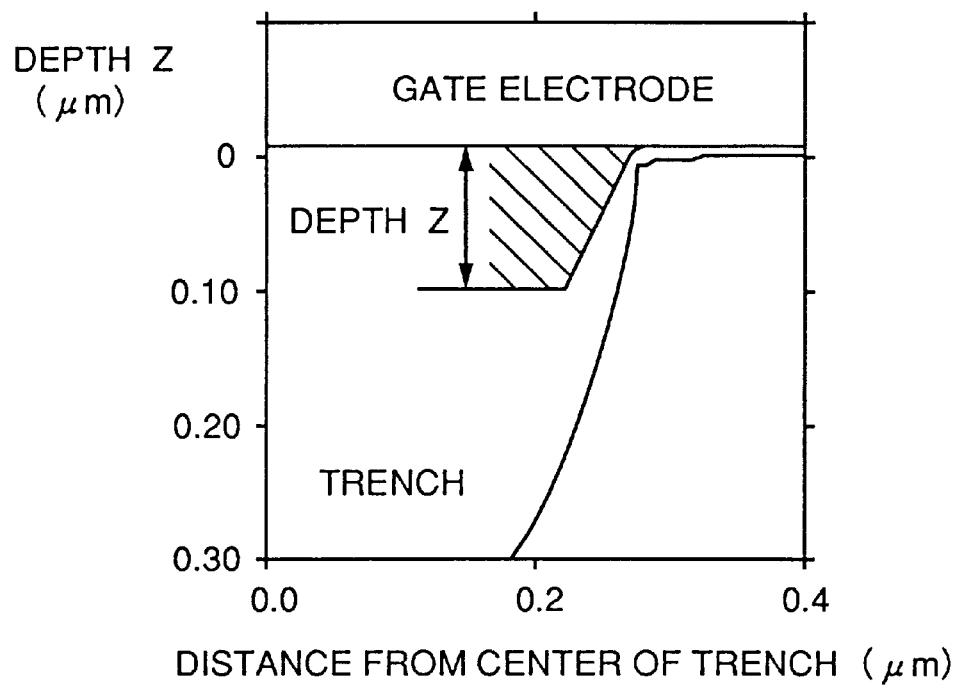
FIG. 7 shows the definition of depth z of a recess when the analysis of the present invention is applied to a structure where the upper portion of the insulation film buried in the trench isolation is recessed.
Figure 8:
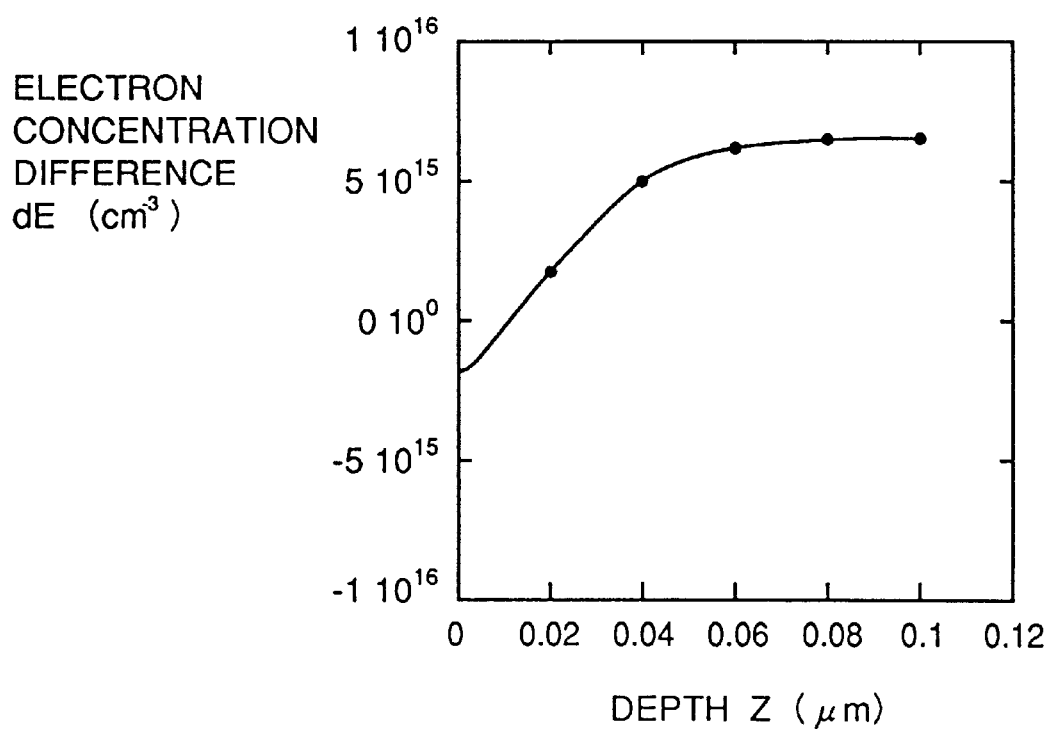
FIG. 8 shows the dependency of electron concentration difference $\Delta E$ on depth z of the recess when the analysis of the present invention is applied to a structure where the upper portion of the insulation material filling the trench isolation is recessed.

This analysis is applied to the structure where the upper portion of the insulation film filling the trench is recessed to evaluate the dependency of electron concentration difference $\Delta E$ on the depth of the recess. The depth of the recess as shown in FIG. 7 is taken as a parameter for analysis. A gate electrode formed of polycrystalline silicon is buried in this recess. According to this structure, the dependency of electron concentration difference $\Delta E$ on the depth of the recess when Vg=0.5V is applied to the gate electrode is shown in FIG. 8. The equation of a regression curve obtained from this result is:

$$\Delta E(Z)=z_5Z^5+z_3Z^4+z_2Z^2+z_1Z+z_0 (0 \leq Z \leq 0.10 \ \mu m)$$

$z_5=-8.00\times10^{21}$ $z_4=2.36\times10^{21}$ $z_3=-2.44\times10^{20}$ $z_2=8.94\times10^{18}$ $z_1=7.17\times10^{16}$ $z_0=-1.81\times10^{15}$ [Equation 6]

It is therefore appreciated that $\Delta E>0$ when the depth becomes greater than $0.013 \ \mu m$ to result in generation of an inverse narrow channel effect.

Figure 9:
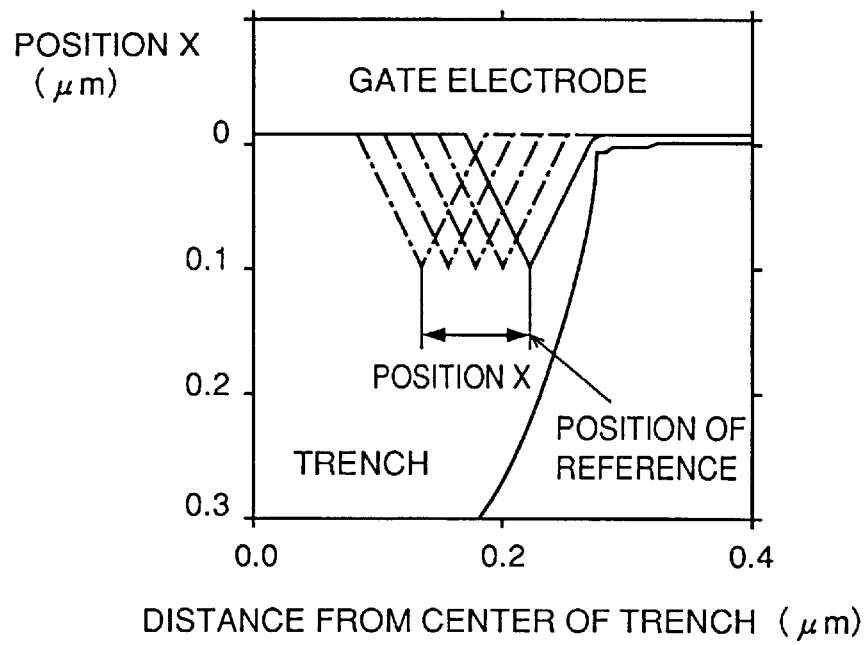
FIG. 9 shows the definition of position x of the recess when the analysis of the present invention is applied to a structure where the upper portion of the insulation film buried in the trench is recessed.
Figure 10:
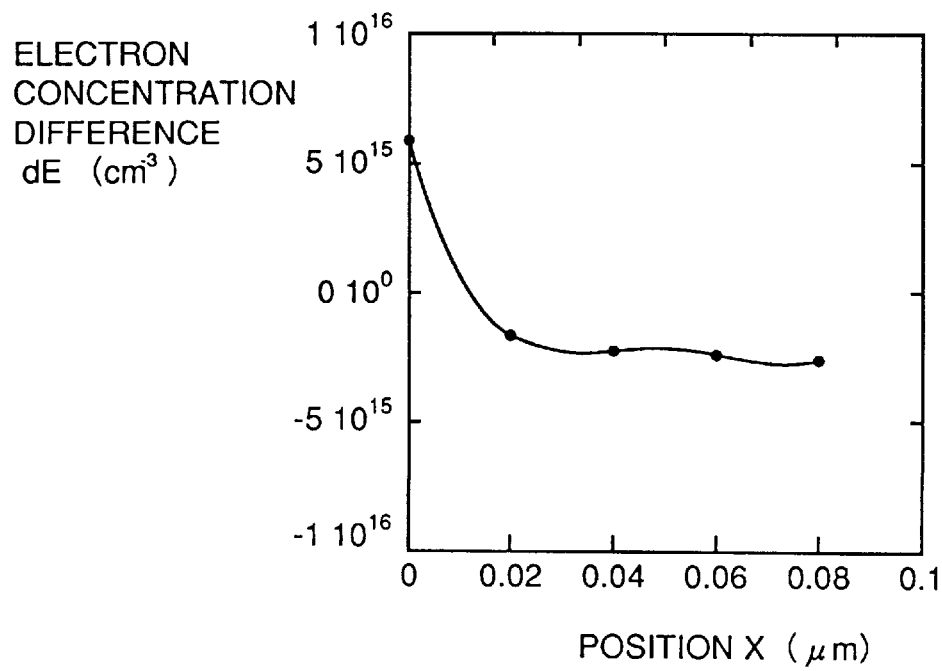
FIG. 10 shows the dependency of electron concentration difference $\Delta E$ on position x of the recess when the analysis of the present invention is applied to a structure where the upper portion of the insulation film filling the trench is recessed.

In a structure where the upper portion of an insulation film buried in a trench is recessed, the dependency on the horizontal direction position of the recess will be evaluated. The position of the recess shown in FIG. 9 is taken as the parameter for analysis. The reference position is where this recess is closest to the trench edge (upper end corner of trench). The upper polycrystalline silicon electrode is provided in this recess. The dependency of electron concentration difference dE on the position of the recess when Vg=0.5V is applied to the gate electrode is shown in FIG. 10. An equation of the regression curve obtained from this result is as follows.

$$\Delta E(X)=x_4X^4+x_3X^3+x_2X^2+x_1X+x_0 (0 \leq X \leq 0.08 \ \mu m)$$

$x_4=1.62\times10^{21}$ $x_3=-3.27\times10^{20}$ $x_2=2.38\times10^{19}$ $x_1=-7.3\times10^{17}$ $x_0=6.72\times10^{15}$ [Equation 7]

It is appreciated that $\Delta E \geq 0$ when position X is less than $0.015 \ \mu m$ to result in generation of an inverse narrow channel effect.

By optimizing the cross sectional configuration of the trench from the above analysis, the formation of an inversion layer at the edge of the trench can be suppressed. Thus, a transistor having the inverse narrow channel effect (or hump phenomenon) suppressed can be formed.

Specific embodiments of the present invention on the configuration of the trench isolation cross section and the trench isolation formation step respectively derived from the above-described analysis will be described hereinafter. Particularly, first to third embodiments describe the trench isolation cross section configuration, and fourth to eighth embodiments describe the trench isolation formation process.

First Embodiment

The first embodiment of the present invention will be described with reference to FIGS. 1, 11 and 12. According to the first embodiment, insulation film 8 is buried in trench 6. Gate electrode 22 is formed thereon with gate oxide film 21 therebetween. There is a projection protruding higher than the main surface of silicon substrate 1. The projection is formed having a configuration that inhibits the inverse narrow channel effect (or hump effect) according to the above-described analysis. Various modifications are allowed for the configuration of this projection. Specifically, a configuration having both side portions rounded as shown in FIG. 1, a tapered configuration as shown in FIG. 11 where the distance between opposite sidewalls becomes smaller as a function of height, and a configuration as shown in FIG. 12 where both sidewalls are upright perpendicular to the main surface of silicon substrate 1 can be applied.

Figure 11:
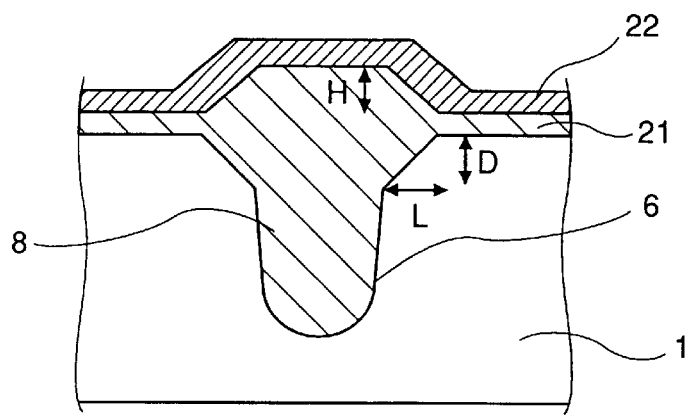
FIGS. 11, 12, and 13 are sectional views of examples of a trench isolation structure according to the present invention.
Figure 12:
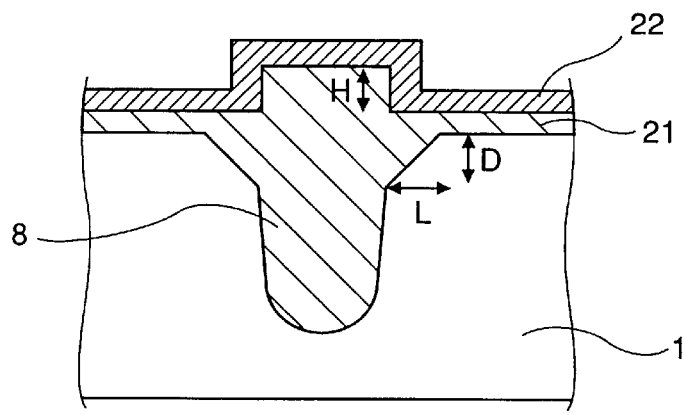

Although the upper edge corner of trench 6 is formed to have a chamfered tapering configuration in FIGS. 1, 11, and 12, this corner portion may be rounded. Alternatively, the corner portion may be left having an edge configuration.

Second Embodiment

The second embodiment of the present invention will be described with reference to FIGS. 13, and 14B. In this embodiment, the top surface of insulation film 8 buried in trench 6 is planarized to be substantially in flush with the main surface of silicon substrate 1. The upper edge corner of trench 6 is formed having a chamfered tapering configuration as shown in FIG. 13 or a rounded configuration as shown in FIGS. 14A and 14B.

Figure 13:
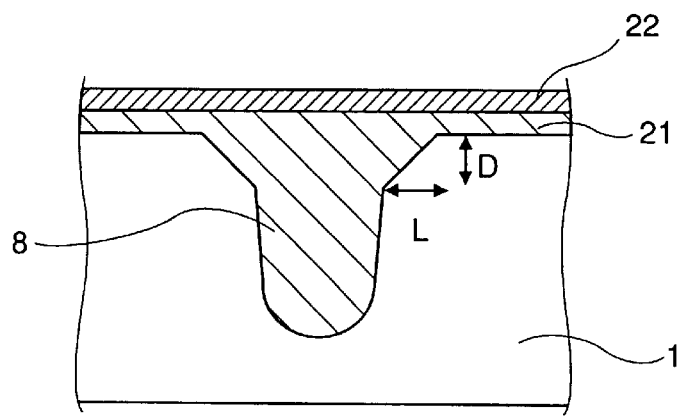
Figure 14A:
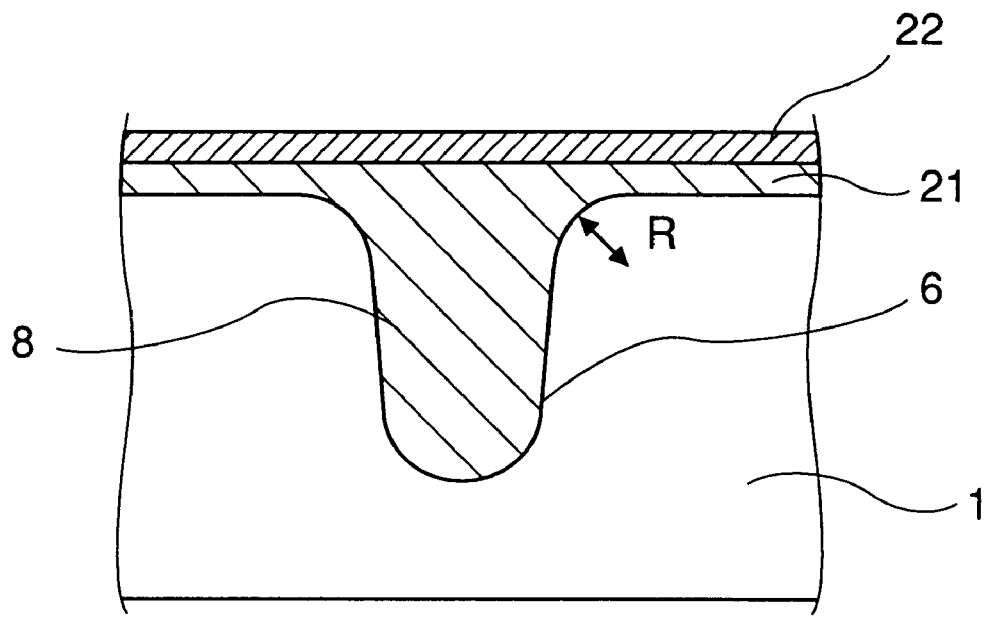
FIG. 14A is a schematic cross sectional view of a modification of trench isolation structure according to the present invention.
Figure 14B:
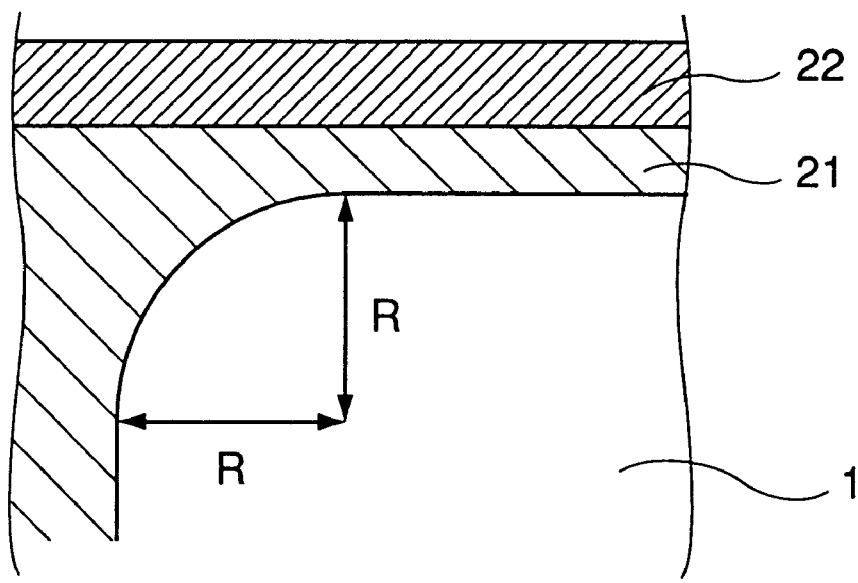
FIG. 14B is an enlarged sectional view in the proximity of the upper edge corner of the trench of FIG. 14A.
Figure 15A:
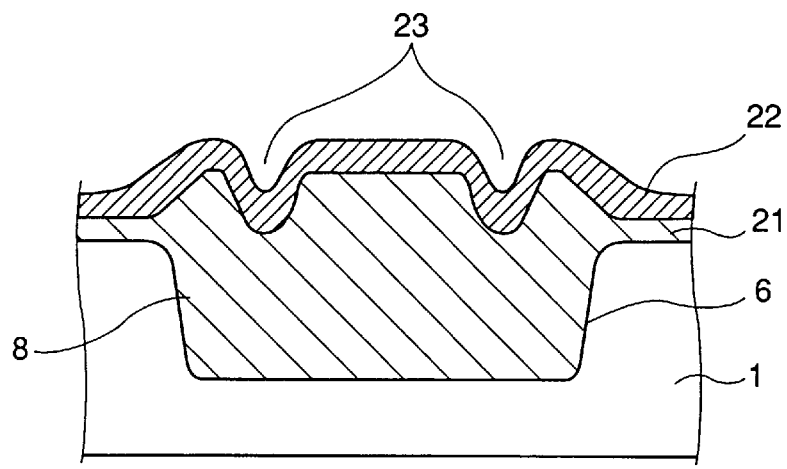
FIGS. 15A, 15B and 15C show a structure of the present invention having a plurality of recesses formed at the upper portion of an insulation film buried in a trench, particularly three examples where the insulation film protrudes from the main surface of the silicon substrate.
Figure 15B:
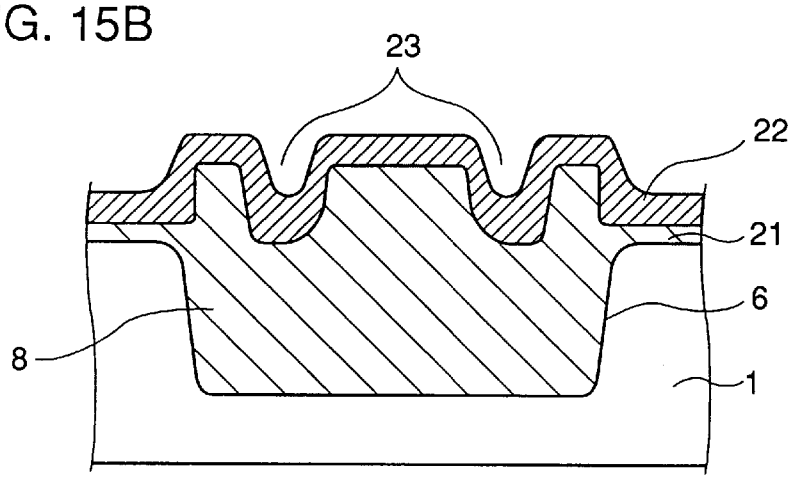
Figure 15C:
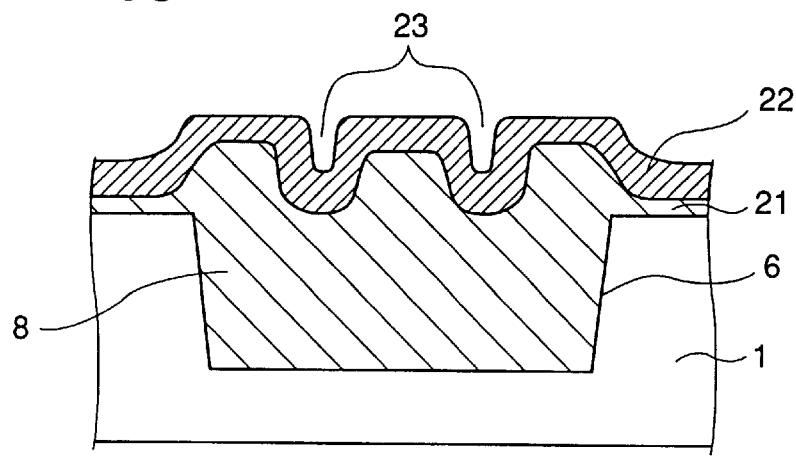

Specifically, the inverse narrow channel effect is inhibited by the structure shown in FIG. 13 in which the upper edge corner of trench 6 has a tapered configuration of $D \leq 0.05 \ \mu m$ and $L \geq 0.05 \ \mu m$. As to the structure shown in FIGS. 14A and 14B, the inverse narrow channel effect is inhibited by setting the radius of curvature R of the upper edge corner of trench 6 to at least $0.04 \ \mu m$ according to the above analysis result described with reference to FIGS. 5 and 6.

Third Embodiment

The third embodiment of the present invention will be described hereinafter with reference to FIGS. 15A–18B. In this embodiment, there is a recess 23 in the proximity of at least both side ends of trench 6 at the top surface of insulation film 8 buried in trench 6. This recess 23 is set to satisfy the condition of:

$x \geq 45.8d^3 - 11.9d^2 + 1.0d + 0.01$ $x>0, d>0$ where d is the depth of each recess 23 from the top surface of gate oxide film at a planarized level with no recess, and x is the shortest distance between gate electrode 22 formed on the recess and the sidewall of trench 6.

This structure of the present embodiment suppressing generation of an inverse narrow channel effect is realized by controlling the configuration of the recess formed in the etchback step after the formation of insulation film 8 within trench 6, taking advantage of the fact that a recess is easily formed in insulation film 8 in the proximity of both side ends of trench 6.

Various modifications of the cross section of insulation film 8 and recess 23 are possible in the present embodiment. In a structure where insulation film 8 filling trench 6 protrudes higher than the main surface of silicon substrate 1, the configuration shown in FIG. 15A in which both sidewalls of the projection is tapered, the configuration shown in FIG. 15B in which both sidewalls of the projection rise perpendicular to the main surface of silicon substrate 1, and the configuration shown in FIG. 15C in which both sidewalls of the projection have a rounded configuration can be applied.

Figure 16A:
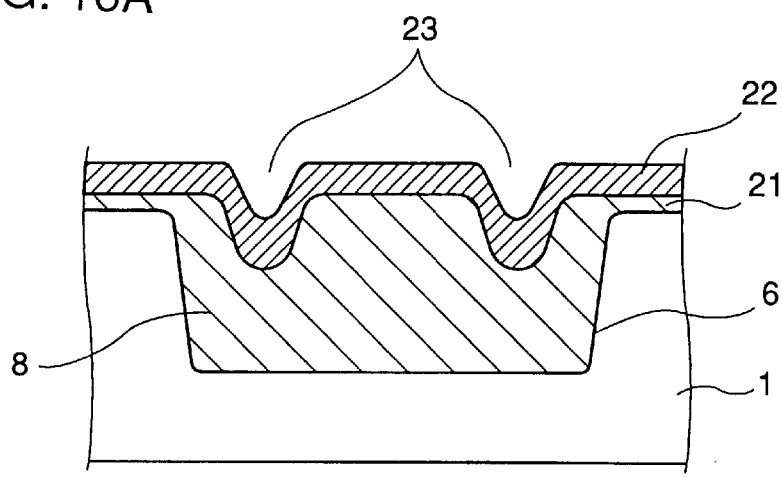
FIGS. 16A, 16B, and 16C show a structure of the present invention having a plurality of recesses formed at the upper portion of an insulation film buried in a trench, particularly three examples where the top surface of the insulation film is substantially in flush with the main surface of the silicon substrate.
Figure 16B:
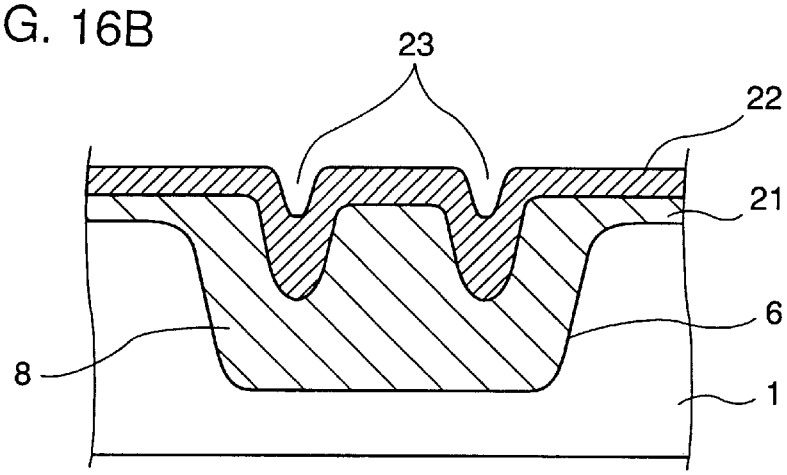
Figure 16C:
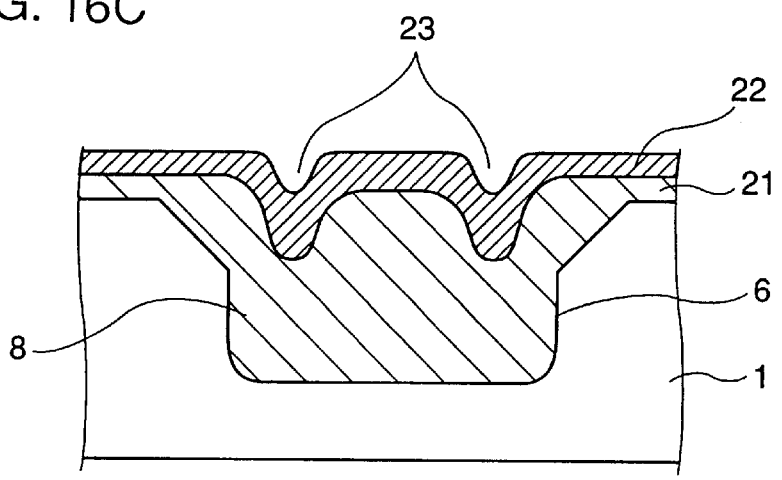
Figure 17A:
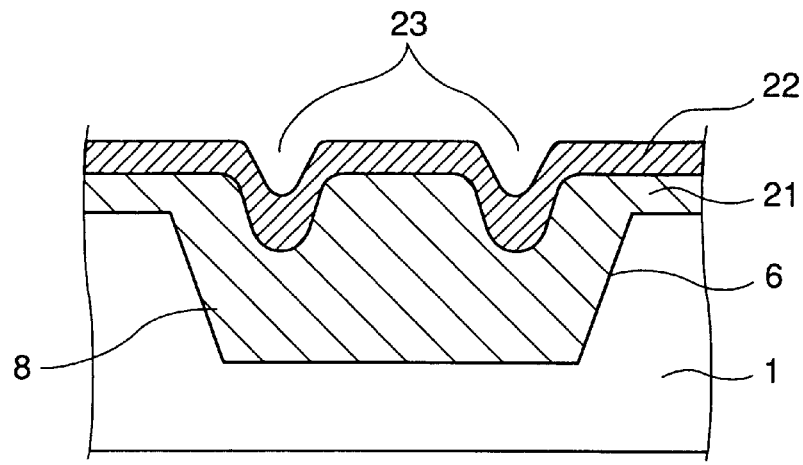
Figure 17B:
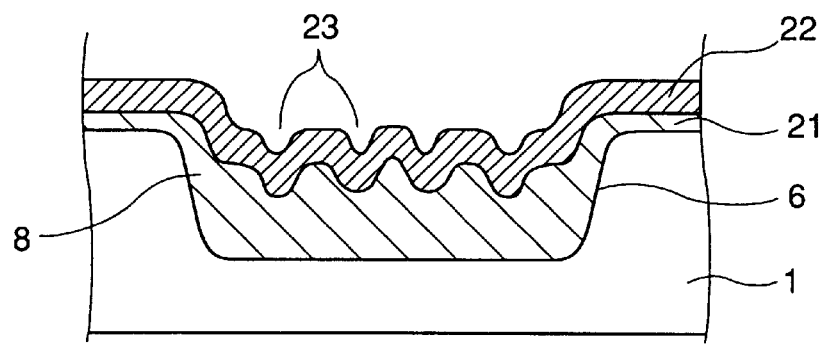
Figure 17C:
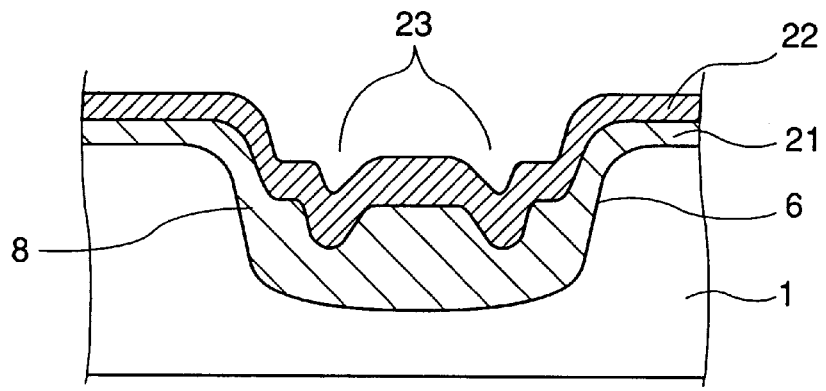
Figure 18A:
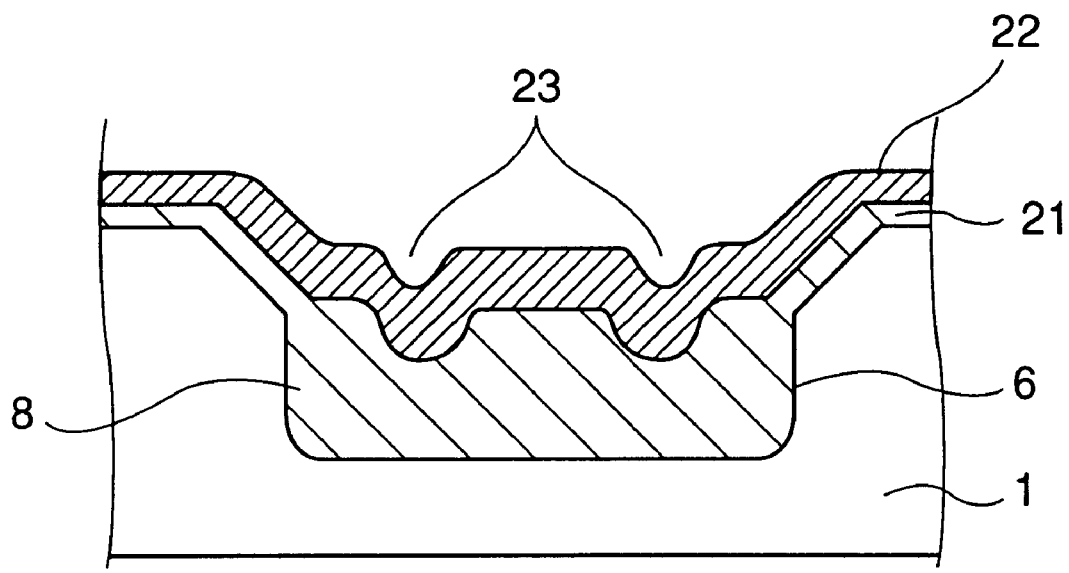
FIGS. 18A and 18B show a structure of the present invention having a plurality of recesses formed at the upper portion of the insulation film filling the trench, particularly showing two examples where the entire top surface of the insulation film is located lower than the main surface of the silicon substrate.
Figure 18B:
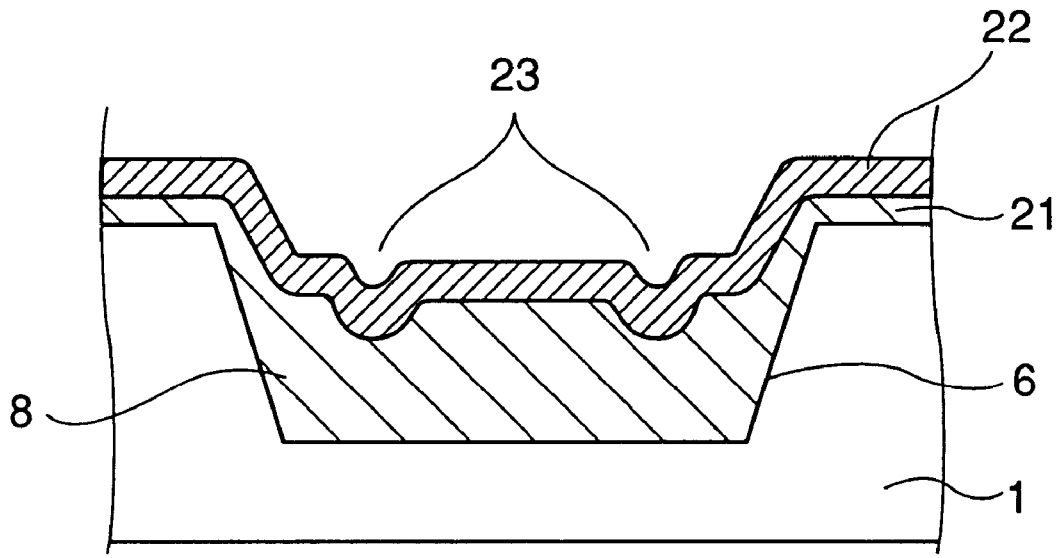

In a structure where insulation 8 filling trench 6 is substantially in flush with the main surface of silicon substrate 1, generation of the inverse narrow channel effect is suppressed by forming a recess 23 at the top surface of insulation film 8 at either side ends of trench 6 as shown in FIG. 16A. According to this structure, the configuration shown in FIG. 16B in which both upper edge corners of trench 6 is rounded, the configuration shown in FIG. 16C in which both upper edge corners of trench 6 is tapered, and the configuration shown in FIG. 17A in which the entire sidewalls of trench 6 is tapered can be applied.

The effect of suppressing generation of the inverse narrow channel effect can be promoted by providing a structure in which the entire top surface of insulation film 8 filling trench 6 is recessed downwards lower than the main surface of silicon substrate 1, and in which recess 23 is formed at the proximity of both side ends of trench 6. Specific modifications of this structure are shown in FIGS. 17B, 17C, 18A and 18B.

Fourth Embodiment

Figure 19A:
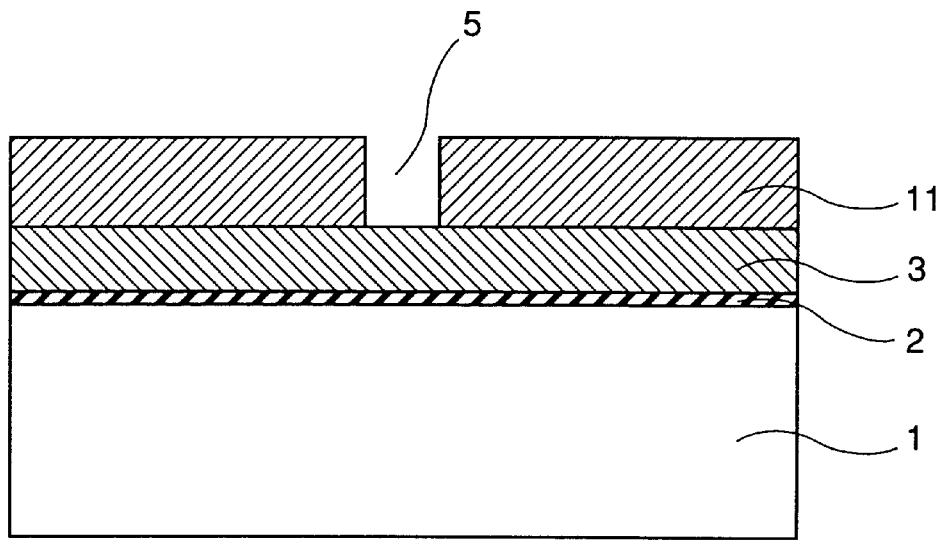
FIGS. 19A–19C are sectional views sequentially showing the former three steps of a trench isolation formation method according to a fourth embodiment of the present invention.

A fourth embodiment of the present invention will be described hereinafter with reference to FIGS. 19A–20C. The present embodiment to the eighth embodiment relates to a method of manufacturing a trench isolation structure according to the present invention. Referring to FIG. 19A, silicon oxide film 2, silicon nitride film 3, and resist 11 are formed in this order on p type silicon substrate 1. Then, photolithography is carried out to leave resist 11 on p type silicon substrate 1 corresponding to the region of an active region. Silicon oxide film 2 is formed by, for example thermal oxidation of p type silicon substrate 1. In this case, the thickness is set to 10–30 nm. The total thickness of silicon oxide film 2 and silicon nitride film 3 is set to be 160–380 nm. Silicon oxide film 2 is provided between silicon substrate 1 and silicon nitride film 3 to prevent degradation of the function of the semiconductor device. If silicon nitride film 3 is directly formed on p type silicon substrate 1, distortion occurs in p type silicon substrate 1 due to stress or the like. Then, silicon nitride film 3 and silicon oxide film 2 are subjected to reactive ion etching or the like with resist 11 that was patterned by the photolithography process as a mask. Opening 5 is formed, and then resist 11 is removed.

Figure 19B:
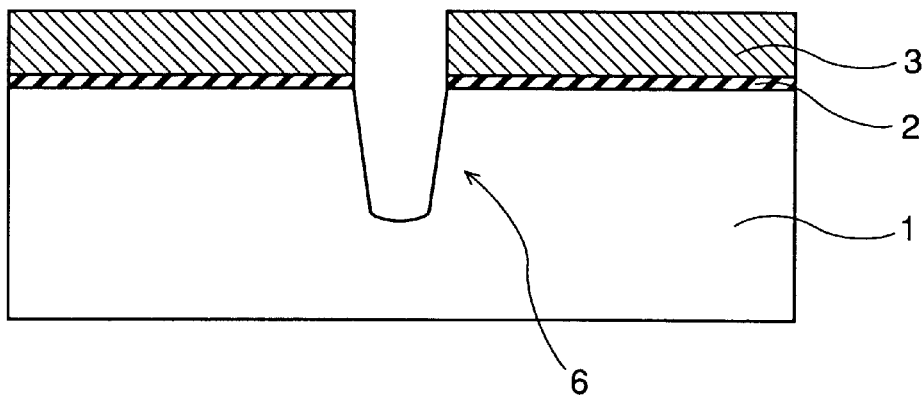

Referring to FIG. 19B, p type silicon substrate 1 right under opening 5 formed in silicon nitride film 3 and silicon oxide film 2 is removed to form trench 6. The depth of trench 6 is controlled by adjusting the etching time period. In practice, the optimum depth of trench 6 depends upon the electric characteristics. As a standard, the depth is selected to be approximately 0.15–0.3 $\mu$m (1 to 2 times the isolation width) with respect to an isolation width of 0.15 $\mu$m.

Figure 19C:
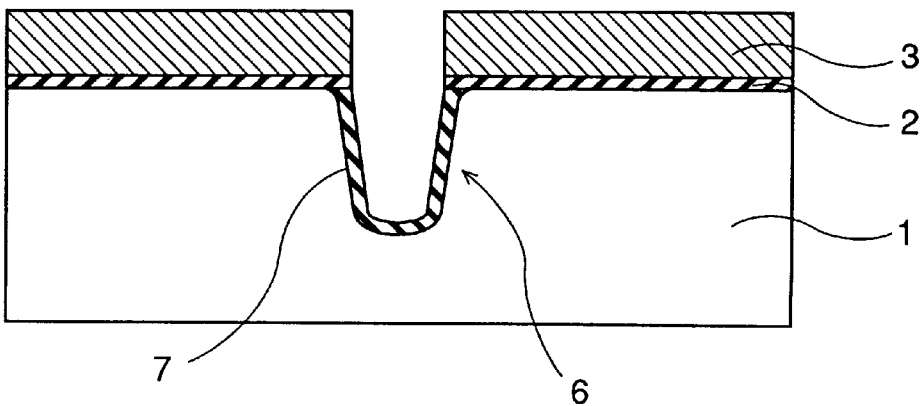

Referring to FIG. 19C, silicon oxide film 7 is formed at the inner wall of trench 6 by thermal oxidation. Thermal oxidation progresses as a result of reaction of the silicon in silicon substrate 1 and oxygen. Oxygen is supplied to the silicon of silicon substrate 1 also through silicon oxide film 2. Therefore, supply of oxygen towards the inner wall portion beneath silicon oxide film 2 is promoted to result in a thicker portion of silicon oxide film 7 in this area. The configuration of the edge formed at the upper corner of trench 6 (distances L and D shown in FIG. 1) is defined by this step. Distances L and D differ according to the thermal oxidation condition, the thickness of silicon oxide film 2, the thickness of silicon nitride film 3, and the like. By controlling these conditions, the configuration of the edge at the upper end corner of trench 6 (particularly distances L and D) can be optimized.

The thermal oxidation step for forming silicon oxide film 7 at the inner wall of trench 6 is carried out at a high temperature of at least 1000° C. and/or at a high pressure of at least 1 atmospheric pressure. Accordingly, silicon oxide film 7 of 10–50 nm in thickness is formed at the inner wall of trench 6.

Figure 20A:
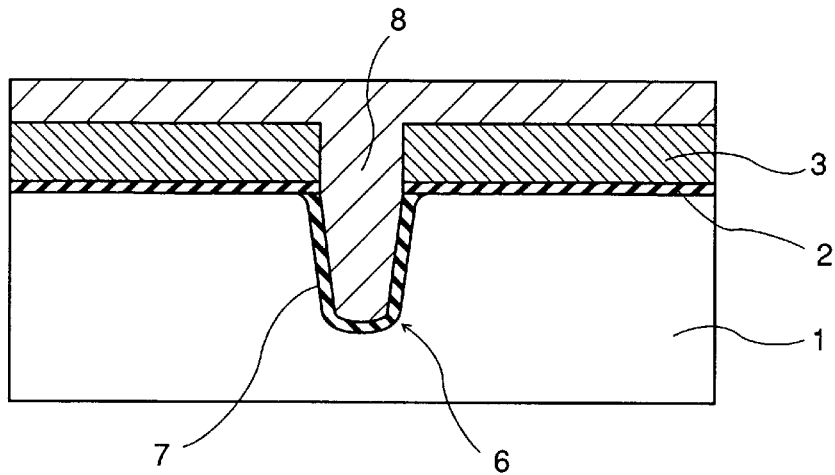
FIGS. 20A–20C are sectional views sequentially showing the latter three steps of the trench isolation formation method of the fourth embodiment of the present invention.
Figure 20B:
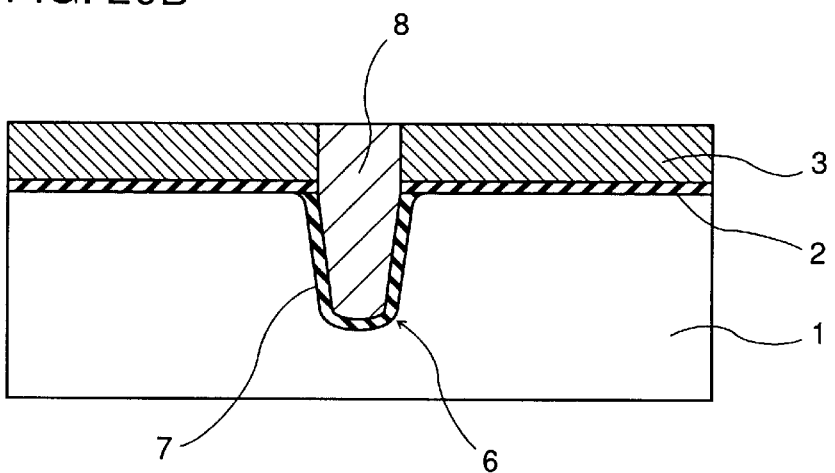

Referring to FIG. 20A, insulation film 8 is deposited in trench 6. Various materials can be applied for insulation film 8. Particularly, a silicon oxide film, a silicon nitride film, a silicon oxide nitride film, and the like are used. Alternatively, insulation film 8 can be formed by a combination of silicon or metal and the above-described insulation material as long as the insulation of trench 6 is maintained. In this case, an insulation film must be provided at the boundary between the trench isolation and the active region. By carrying out an etch back process or by chemical mechanical abrasion as shown in FIG. 20B after the deposition of insulation film 8, insulation film 8 is selectively removed so as to be left only at the region of the trench isolation. By using selective deposition for selectively depositing silicon oxide film 2 only at the region of trench 6, the processes of FIGS. 20A and 20B can be carried out by one step without using silicon nitride film 3.

The top surface of insulation film 8 filling trench 6 can be made substantially in flush with the top surface of silicon nitride film 3. Therefore, the height of protrusion (H) from the substrate can be controlled by the thickness of silicon nitride film 3. Also, by effecting overetching in the planarization process to become lower than the upper surface of silicon nitride film 3, the height of the projection (H) from the surface of silicon substrate 1 can be controlled.

Figure 20C:
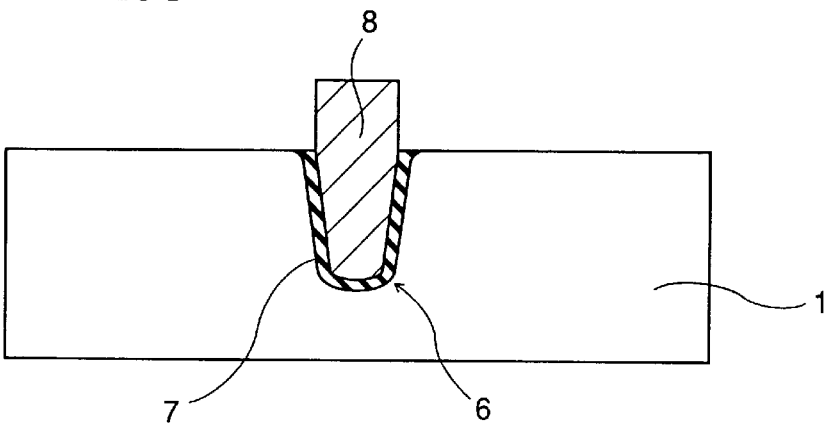

Referring to FIG. 20C, silicon nitride film 3 and silicon oxide film 2 are removed by etching. Then, the elements such as a MOS transistor, a diode, a bipolar transistor, a capacitor, a resistor, and wiring or the like are formed at the active region.

Chemical etching using hydrofluoric acid is effected to remove silicon oxide film 2. The etching rate with respect to hydrofluoric acid differs between silicon oxide film 7 formed at the inner wall of trench 6 and insulation film 8. If insulation film 8 is formed of a CVD silicon oxide film, the etching rate of insulation film 8 is faster than the etching rate of silicon oxide film 7. Therefore, a recess is generated at the boundary of insulation film 8 and silicon oxide film 7. The position where the recess is formed can be controlled by the thickness of silicon oxide film 7 formed at the inner wall of trench 6.

Although a p type silicon substrate is employed as a semiconductor substrate in the above embodiments, an n type silicon substrate may be used. A p well or an n well, and an n type MOS transistor or a P type MOS transistor may be formed.

Figure 29A:
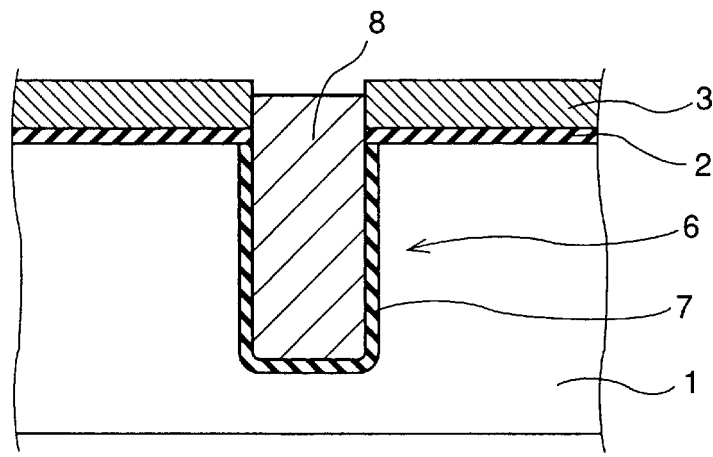
FIGS. 29A–29C are sectional views sequentially showing the latter three steps of the conventional trench isolation formation method.
Figure 29B:
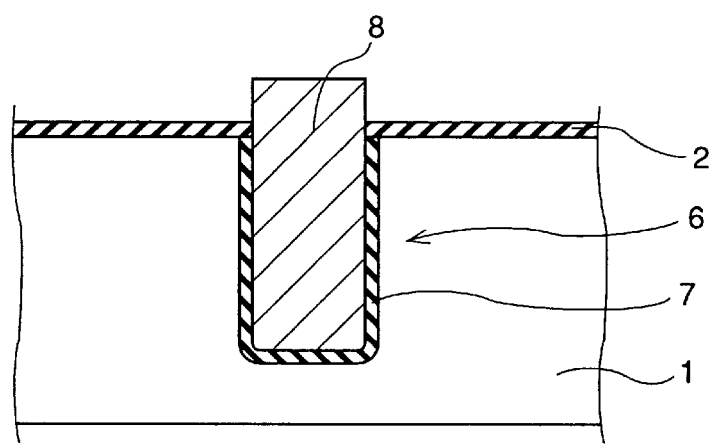
Figure 29C:
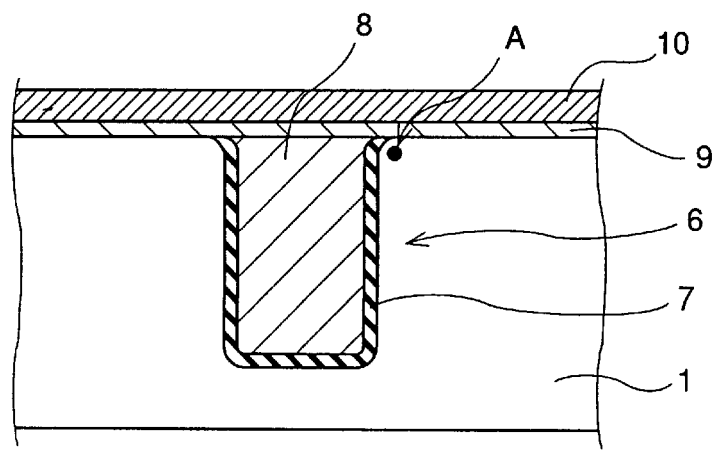

A structure similar to that shown in FIG. 20C can be provided by not removing the projection of insulation film 8 from the main surface of silicon substrate 1 after the formation of the structure shown in FIG. 29B according to the conventional manufacturing method described with reference to FIGS. 28A–29C and the removal of silicon oxide film 2. In this case, silicon oxide film 2/silicon nitride film 3/silicon oxide film 4 are formed to the thickness of 10~30 nm/100~200 nm/50~150 nm, respectively.

Fifth Embodiment

Figure 21A:
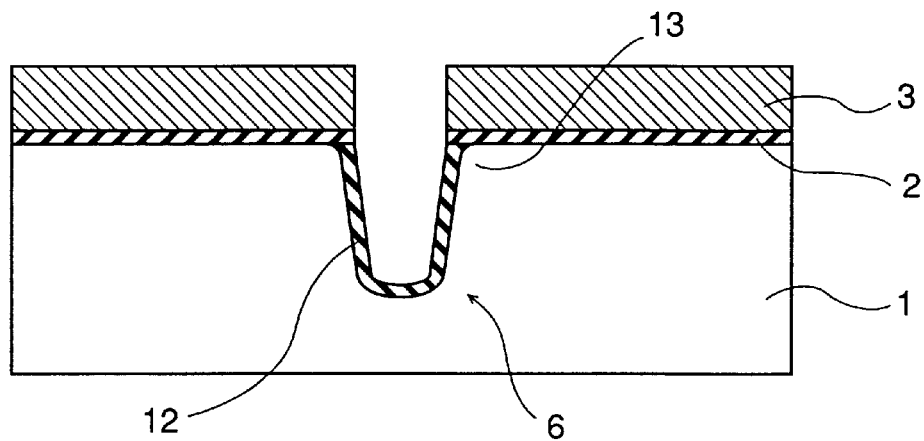
FIGS. 21A–21C are sectional views sequentially showing the steps of a trench isolation formation method according to a fifth embodiment of the present invention.
Figure 21B:
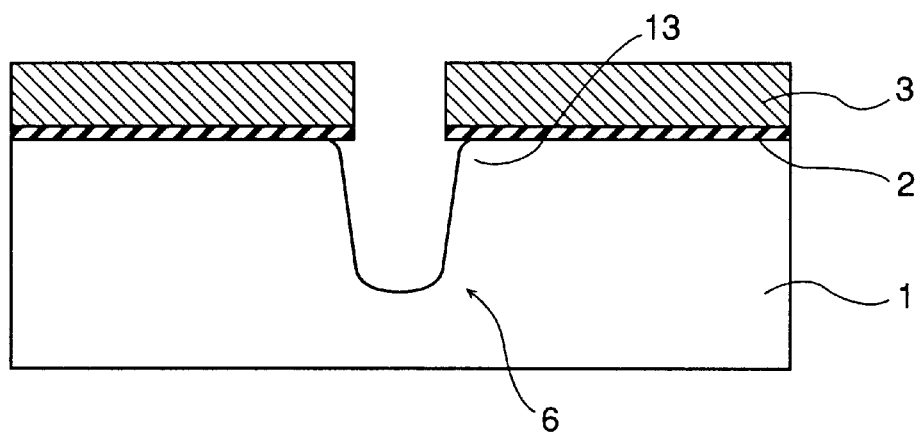

The fifth embodiment of the present invention will be described with reference to FIGS. 21A–21C. The process of the present embodiment has the step shown in FIG. 19C of forming silicon oxide film 7 as a thermal oxidation film in the fourth embodiment replaced with the steps shown in FIGS. 21–21C. More specifically, following the formation of trench 6 as shown in FIG. 19B, the inner wall of trench 6 is thermal-oxidized as shown in FIG. 21A to form a sacrifice oxide film 12. Referring to FIG. 21B, sacrifice oxide film 12 is removed by etching using hydrofluoric acid or the like to form an edge 13 having an appropriate round configuration at the upper corner of trench 6.

Figure 21C:
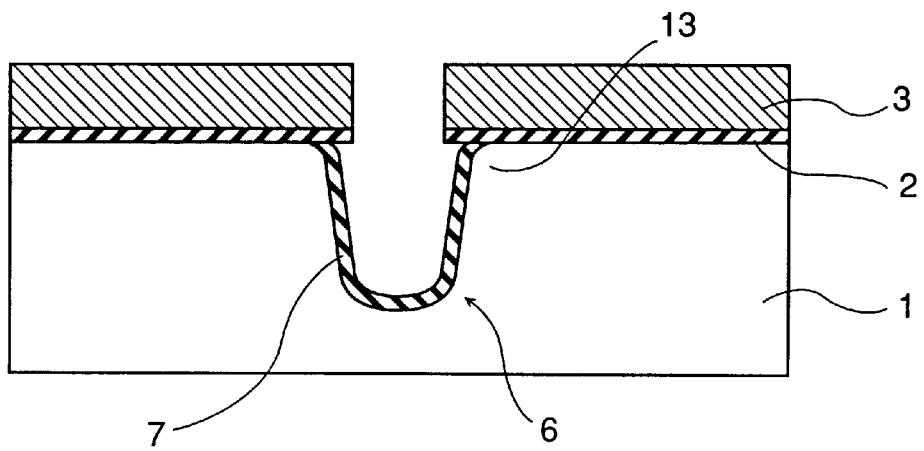

Referring to FIG. 21C, silicon oxide film 7 is formed at the inner wall of trench 6 by thermal oxidation. This thermal oxidation process is necessary to improve the insulation property of trench 6. Similar to the process in the fourth embodiment, this step is carried out at a high temperature of at least 1000° C., and/or at a high pressure of at least 1 atmospheric pressure to result in silicon oxide film 7 of 10~50 nm in thickness at the inner wall of trench 6. Since the oxidation for controlling the configuration of the upper end corner (21A) and the oxidation for improving the insulation characteristics of trench 6 (FIG. 21C) are carried out independently, trench isolation further improved in electric characteristics can be realized comparable to the fifth embodiment. The subsequent steps are similar to those steps following that of FIG. 20A of the fourth embodiment.

Sixth Embodiment

The sixth embodiment of the present invention will be described hereinafter with reference to FIGS. 22A–23C. In the present embodiment, the structure of the layer covering the active region in the fourth embodiment is replaced with another structure, and the configuration of the portion of the insulation film protruding from the main surface of the semiconductor substrate buried in the trench is altered.

Figure 22A:
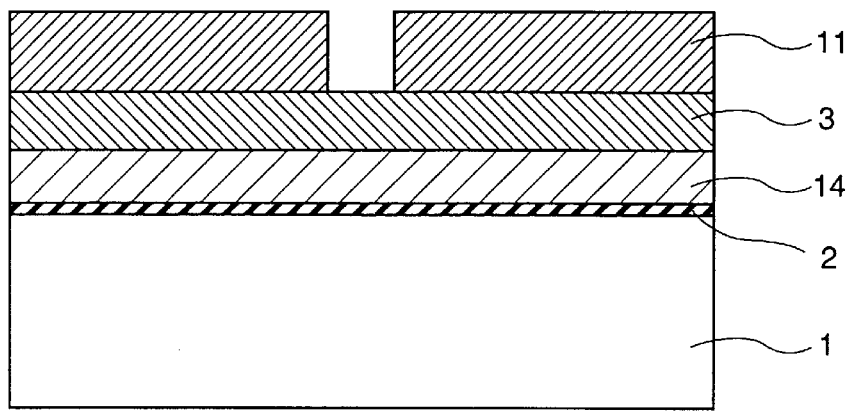
FIGS. 22A–22C are sectional views sequentially showing the former three steps of a trench isolation formation method according to a sixth embodiment of the present invention.
Figure 22B:
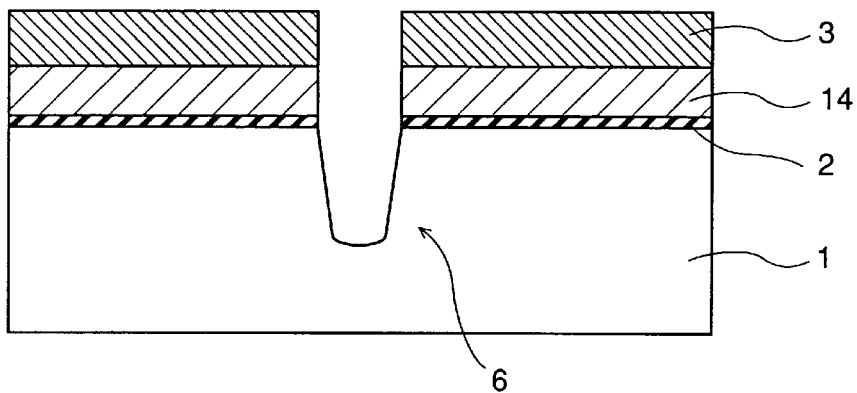
Figure 22C:
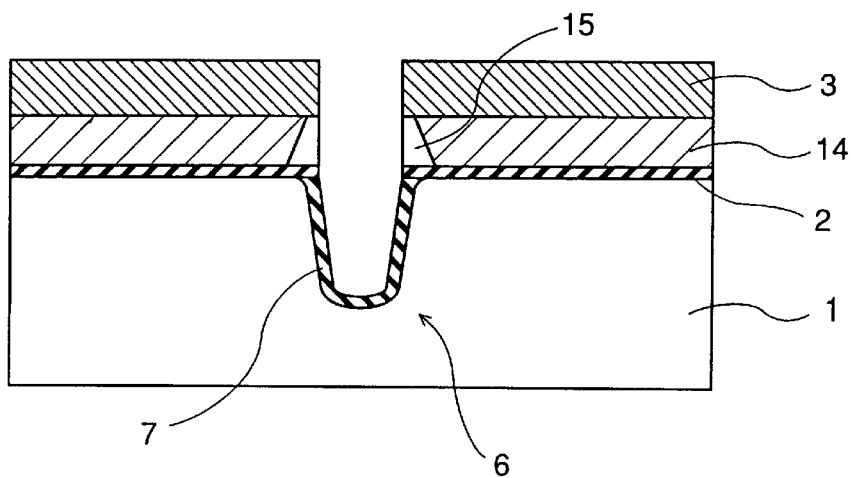

Referring to FIG. 22A, silicon oxide film 2, polycrystalline silicon 14, silicon nitride film 3, and resist 11 are layered in this order on p type silicon substrate 1. Photolithography is carried out to leave resist 11 corresponding to the active region. Then, reactive ion etching and the like is applied to silicon nitride film 3, polycrystalline silicon 14, and silicon oxide film 2 using the pattern of resist 11 to form opening 5. Then, resist 1 is removed. Referring to FIG. 22B, a region of p type silicon substrate 1 immediately under opening 5 is removed by etching to form trench 6. Referring to FIG. 22C, silicon oxide film 7 is formed at the inner wall of trench 6 by thermal oxidation. In this step, control of the upper corner edge of trench 6 is carried out simultaneous to the partial conversion of polycrystalline silicon 14 into a tapered silicon oxide film 15.

Figure 23A:
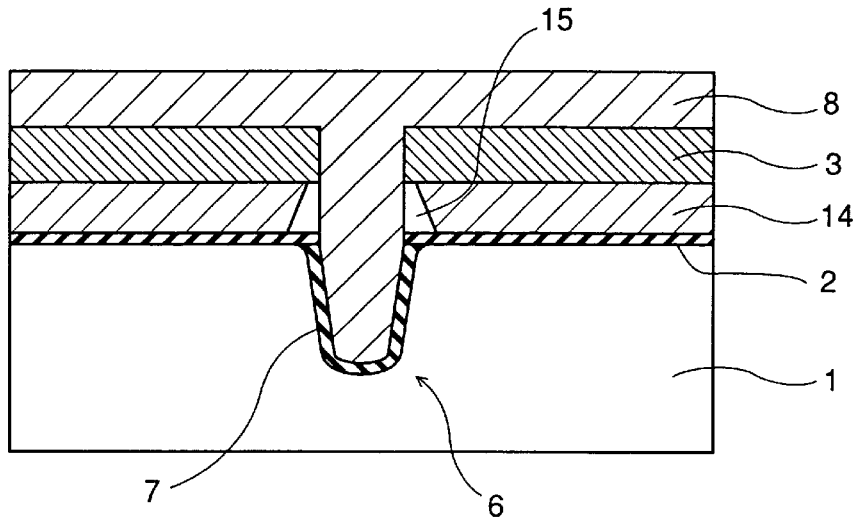
FIGS. 23A–23C are sectional views sequentially showing the latter three steps of the trench isolation formation method according to the sixth embodiment of the present invention.
Figure 23B:
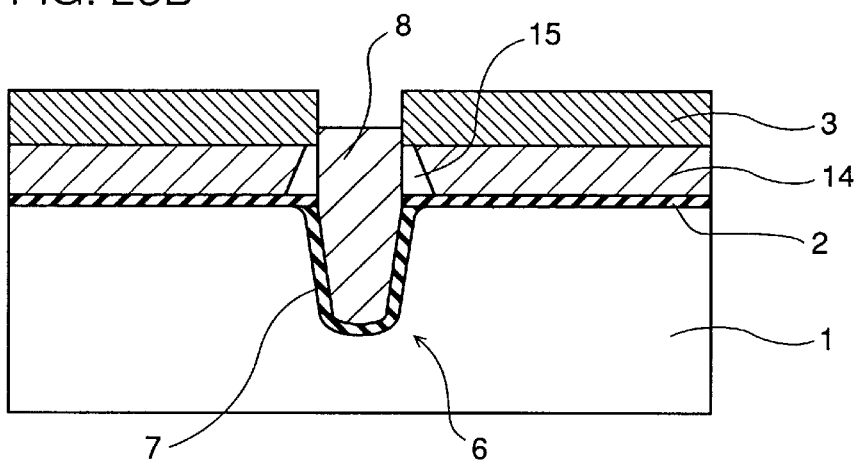

Referring to FIG. 23A, insulation film 8 is deposited in trench 6. A silicon oxide film, a silicon nitride film, a silicon oxide nitride film, or the like can be used as insulation film 8. Also, a combination of silicon or metal and the above-described insulation film can be applied as long as the insulation characteristic of the trench is maintained, as in the above-described fourth embodiment. Referring to FIG. 23B, following deposition of insulation film 8, insulation film 8 is selectively removed to leave a region of trench isolation by an etchback process or chemical mechanical abrasion. By employing a selective deposition process of selectively depositing silicon oxide film 2 only at a region of trench 6, the steps of FIGS. 23A and 23B can be carried out in one step without using silicon nitride film 3. The top surface of the insulation film buried in trench 6 can be made in flush with the top surface of silicon nitride film 3. Therefore, the height of the projection from the substrate can be controlled by the thickness of silicon nitride film 3.

Figure 23C:
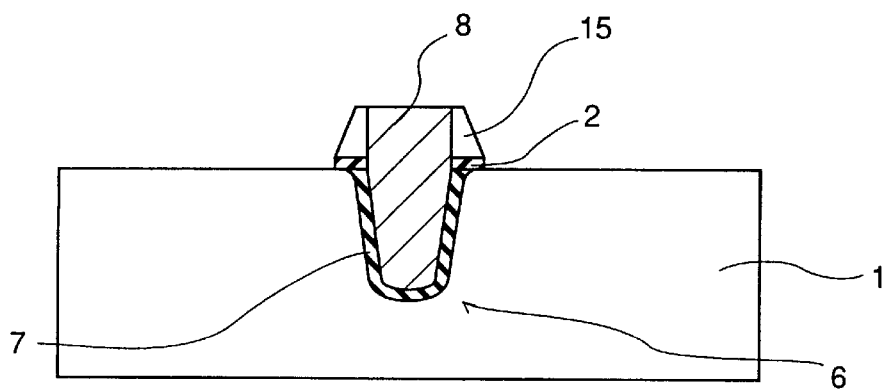

Referring to FIG. 23C, silicon nitride film 2, polycrystalline silicon 14, and silicon oxide film 2 are removed by etching. Here, silicon oxide film 15 which is a partial thermal oxidation of polycrystalline silicon 14 forms a portion of the projection of the trench isolation. A tapered configuration is formed as a result of the effect of oxygen supply from silicon oxide film 2 in the oxidation process of polycrystalline silicon 14. The tapering angle can be controlled by altering the thermal oxidation condition. Then, elements such as a MOS transistor, a diode, a bipolar transistor, a capacitor, a resistor, and interconnection are formed at the active region.

The taper angle of the projection of the trench isolation can be altered by modifying the thickness of silicon nitride film 3 and the thickness of silicon oxide film 2, in addition to altering the thermal oxidation condition. Control is allowed since the degree of oxygen supply differs. The tapered angle can be also controlled by using a film having nitrogen introduced to polycrystalline silicon 14 during ion implantation and deposition. This is because the oxidation rate of silicon depends upon the amount of nitrogen. It is also appreciated that the taper angle can be controlled by replacing polycrystalline silicon 14 with amorphous silicon or monocrystalline silicon.

The method of providing a tapered projection of the trench isolation as in the present embodiment can also be easily applied to the process of the above-described fifth embodiment shown in FIG. 21 including the formation of a sacrifice oxide film. In the present embodiment, an n type silicon substrate may be used instead of a p type silicon substrate, and a p well or an n well and an n type MOS transistor or a p type MOS transistor may be formed.

Seventh Embodiment

Figure 24A:
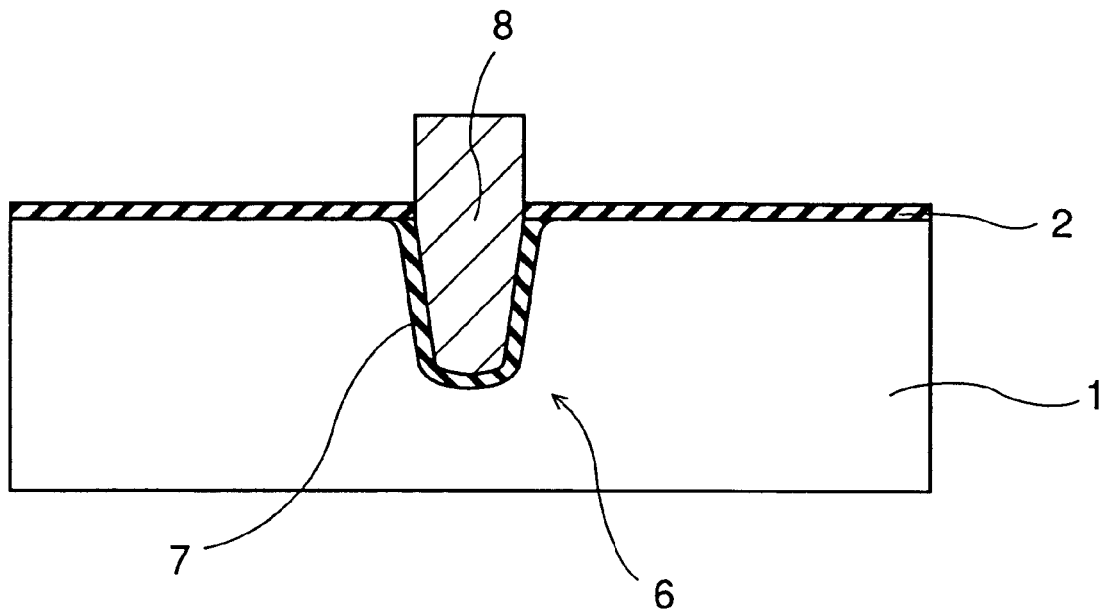
FIGS. 24A and 24B are sectional views sequentially showing the former two steps of a trench isolation formation method according to a seventh embodiment of the present invention.
Figure 24B:
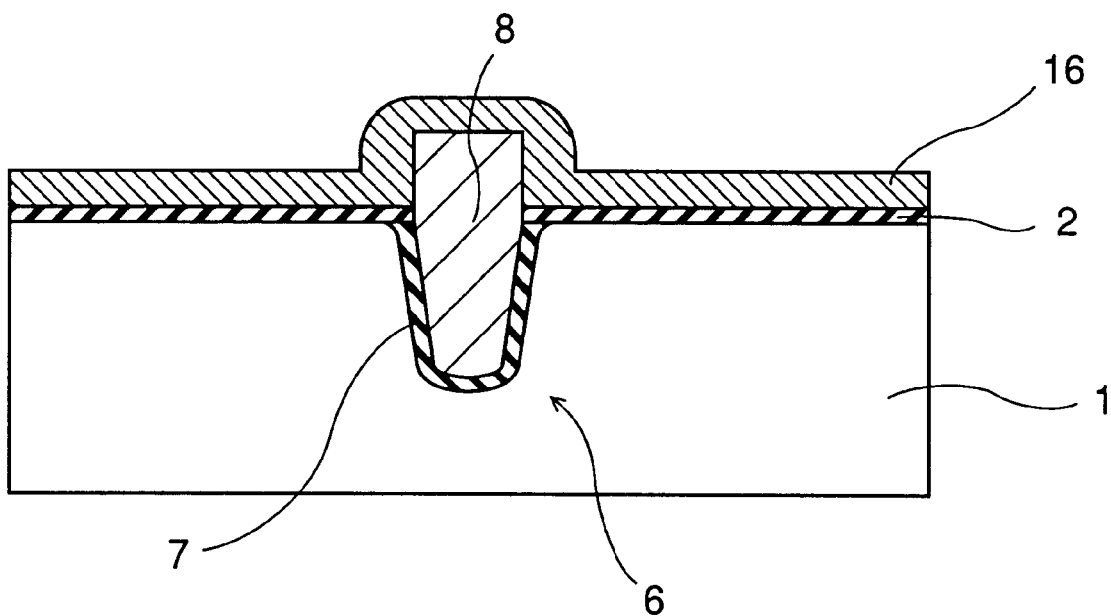
Figure 25A:
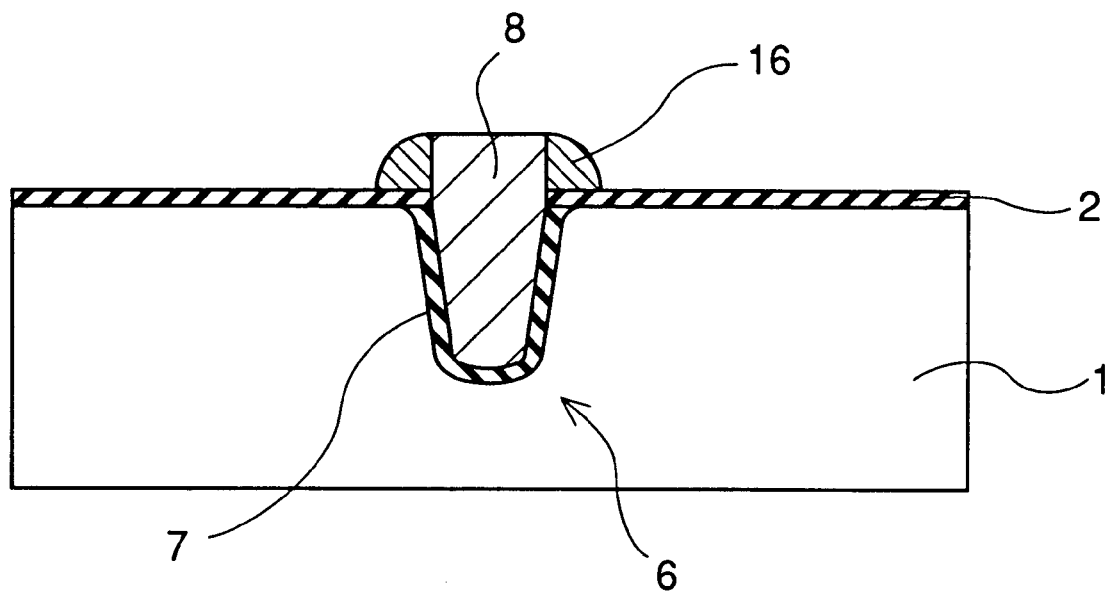
FIGS. 25A and 25B are sectional views sequentially showing the latter two steps of the trench isolation formation method according to the seventh embodiment of the present invention.
Figure 25B:
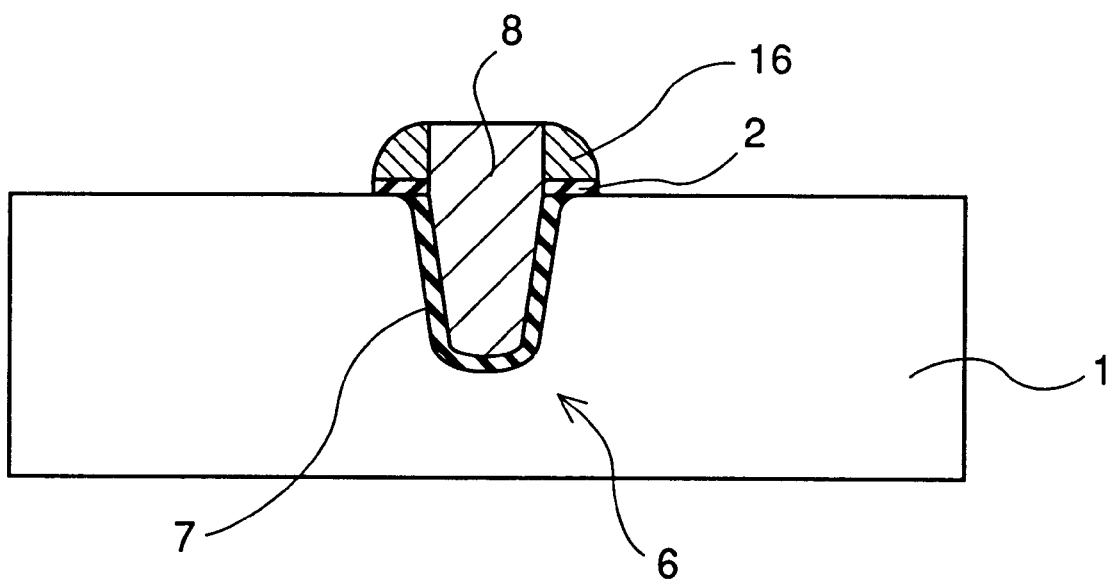

The seventh embodiment of the present invention will be described hereinafter with reference to FIGS. 24A–25B. According to the present embodiment, the steps shown in FIGS. 24A, 24B. 25A and 25B for providing a rounded configuration (or a tapered configuration) of a projection of the trench isolation are added to the step shown in FIG. 20B of the fourth embodiment. In the present embodiment, following formation of the structure shown in FIG. 24A which is similar to FIG. 20B, silicon oxide film 16 is deposited all over to a predetermined thickness as shown in FIG. 24B. Then, anisotropic etching such as dry etching is carried out all over the surface to form a rounded (or tapered) projection of insulation film 8 at the upper portion of trench 6 as shown in FIG. 25A. The eventual configuration of the projection of insulation film 8 of FIG. 24B can be controlled by appropriately modifying the deposition conditions and thermal treatment conditions of silicon oxide film 16. Referring to FIG. 25B, silicon oxide film 2 is removed by etching (either of isotropic or anisotropic etching is allowed). It is to be noted that silicon oxide film 2 can be etched away at the same time in the anisotropic etching step of silicon oxide film 16 shown in FIG. 25A.

A process of introducing impurities such as ion implantation is required to form an integrated circuit. This process of introducing impurities can be carried out immediately after FIG. 24A or immediately after FIG. 25A. A similar effect can be obtained by using a silicon nitride film, an oxynitride, or a composition thereof instead of silicon oxide film 16. Also, the process of sacrifice oxidation as shown in FIG. 21 can be applied in the present embodiment. Furthermore, the steps shown in FIGS. 22A–23A can also be used together.

Eighth Embodiment

The eighth embodiment of the present invention will be described hereinafter with reference to FIGS. 26A–27C. In the present embodiment, the step of forming a trench of the above-described fourth embodiment is replaced with another step to alter the configuration of the insulation film buried in the trench at the upper end corner thereof.

Figure 26A:
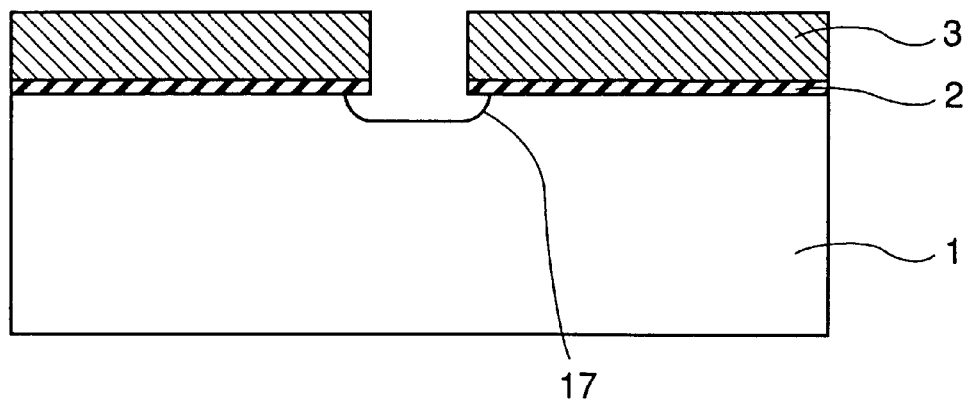
FIGS. 26A–26C are sectional views sequentially showing the former three steps of a trench isolation formation method according to an eighth embodiment of the present invention.
Figure 26B:
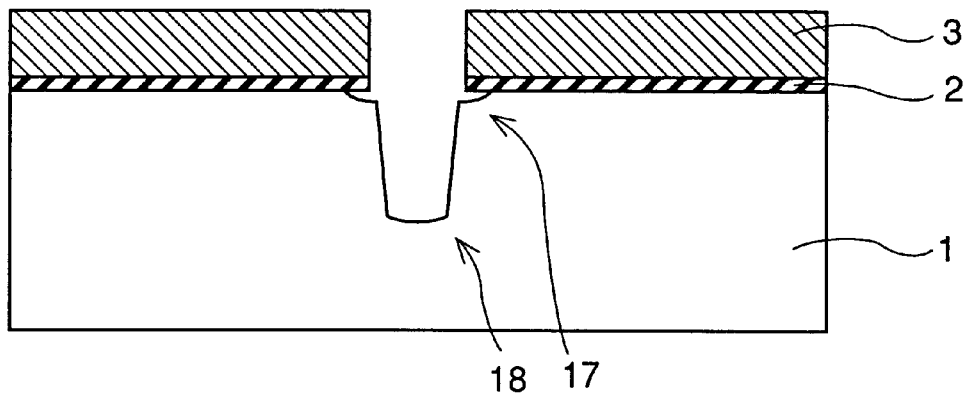

First, silicon oxide film 2, silicon nitride film 3, and resist 11 are layered in this order on p type silicon substrate 1 as shown on FIG. 19. Photolithography is carried out to leave resist 11 corresponding to the portion of an active region. Using resist 11 as a mask, silicon nitride film 3, and silicon oxide film 2 are subjected to reactive ion etching to form opening 5. Referring to FIG. 26A, isotropic etching such as chemical dry etching is carried out using silicon nitride film 3 and silicon oxide film 2 as a mask to form a trench 17 of the first stage. Formation of this trench 17 can be carried out by effecting thermal oxidation, and then removing the thermal oxidation film. Referring to FIG. 26B, a trench 18 of the second stage is formed by anisotropic etching such as reactive ion etching or the like. As a result, a trench of a two-stage structure for trench isolation is formed.

The upper corner of the two-stage trench formed according to the above-described method has an appropriate rounded or tapered configuration due to the formation of trench 17 of the first stage. The configuration of the rounded or tapered corner is determined depending upon the isotropic etching condition and thermal oxidation condition. By controlling the formation conditions of trench 18, the configuration of the upper corner portion can be optimized.

Figure 26C:
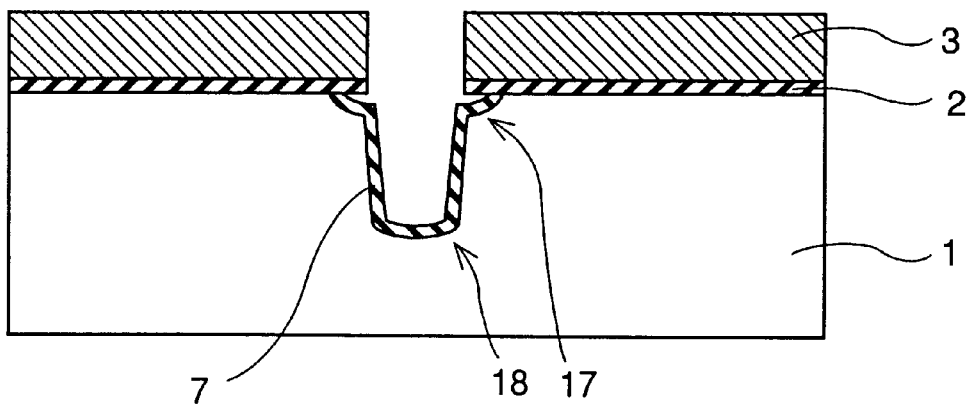
Figure 27A:
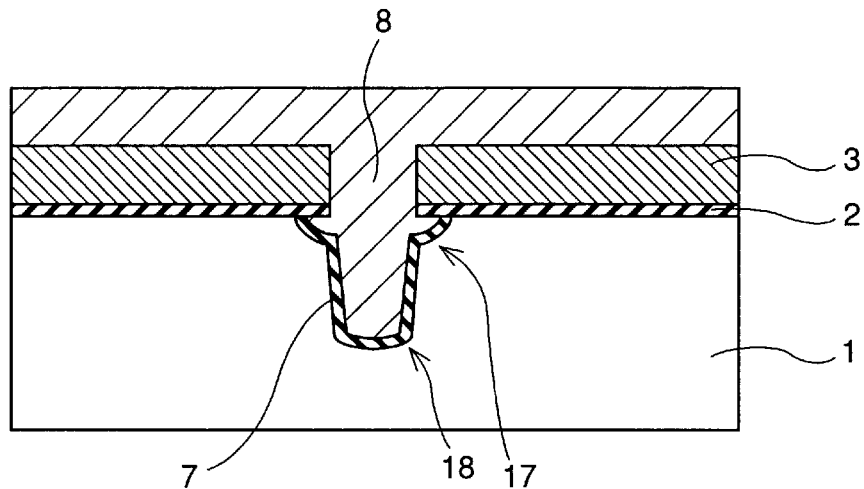
FIGS. 27A–27C are sectional views sequentially showing the latter three steps of the trench isolation formation method according to the eighth embodiment of the present invention.
Figure 27B:
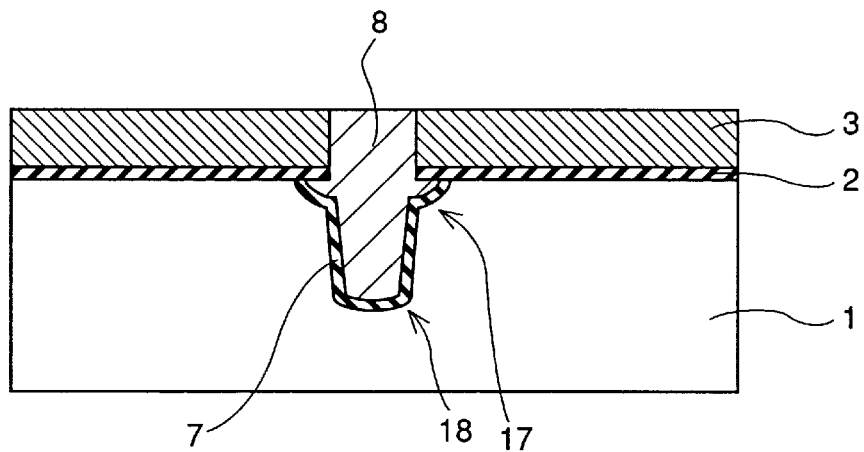
Figure 27C:
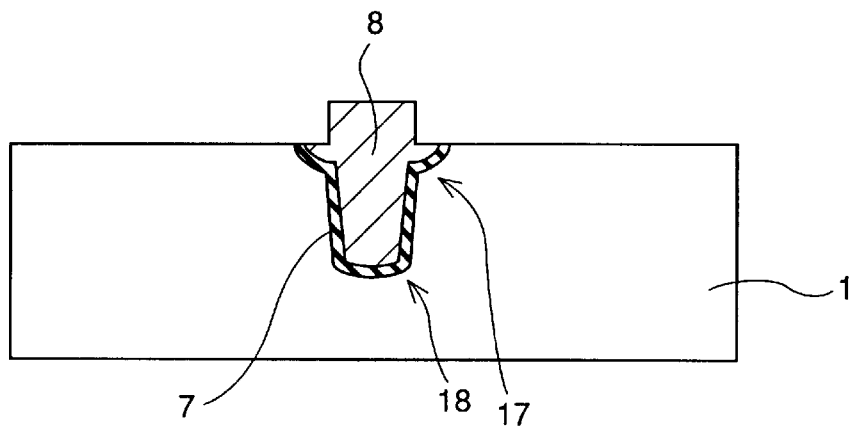
Figure 28A:
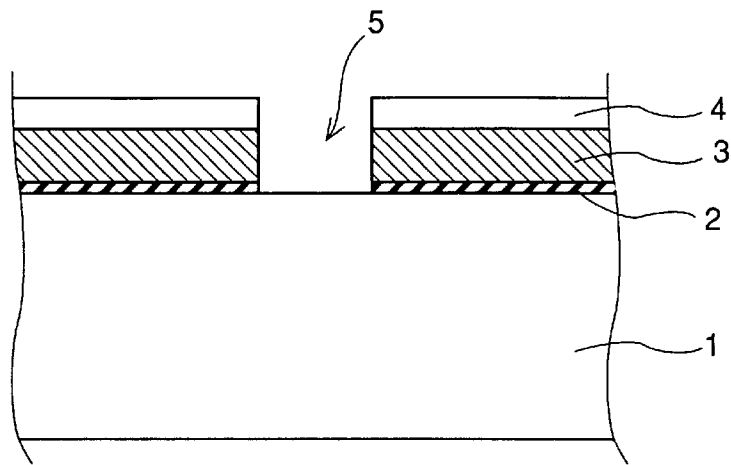
FIGS. 28A–28C are sectional views sequentially showing the former three steps of a conventional trench isolation formation method.
Figure 28B:
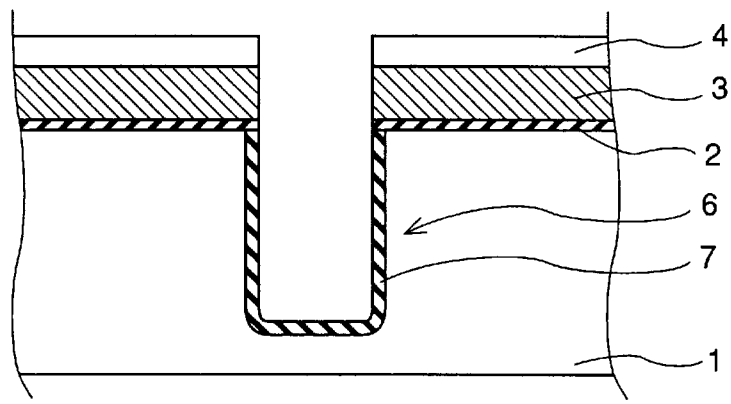
Figure 28C:
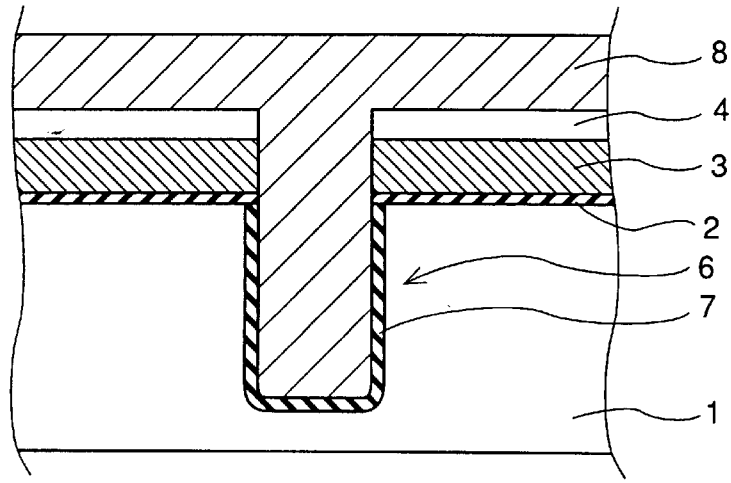

Referring to FIG. 26C, the inner wall of trench 6 is thermal-oxidized to form silicon oxide film 7. Thermal oxide film 7 serves to improve the insulation characteristics of trench 6. Then, insulation film 8 is formed and then etched back as shown in FIGS. 27A–27C. In the present embodiment, the oxidation process (FIG. 26C) to improve the insulation characteristic of trench 7 can be carried out independently by using the etching technique and the thermal oxidation technique for controlling the upper edge corner of trench 7. Therefore, a trench isolation further improved in electric characteristics than that of the fourth embodiment can be realized.

The step of carrying out sacrifice-oxidation as shown in FIG. 21, the step of using a layered structure covering the active region as shown in FIGS. 22A–23C, or the step of forming a rounded or tapered projection at the upper portion of trench as shown in FIGS. 24A–25B can be used together in the present embodiment.

The above-described embodiments are only a way of example, and it is to be understood that various embodiments modified in a range equivalent to the invention described in the scope of claims for patent can be applied.

According to a semiconductor device including a trench isolation structure of the present invention, a perpendicular cross section configuration right under the gate electrode in the extending direction thereof is provided in which the carrier concentration of the active region in the proximity of the trench isolation edge becomes lower than the carrier concentration of the middle portion of the active region while a predetermined bias voltage is applied to the gate electrode. By simply optimizing the configuration of the trench isolation structure, electric field concentration as the end of the trench isolation can be relaxed and generation of the inverse narrow channel effect can be suppressed. As a result, favorable subthreshold characteristics can be obtained. Optimization of the configuration of the trench isolation structure of the present invention can easily be obtained by a simulation using an equation of a regression curve.

By employing a structure having a recess of a predetermined configuration provided at the proximity of the edge of the trench isolation at the top surface of the insulation film buried in the trench as an example of optimization of the configuration of the trench isolation structure, the insulation film can be formed taking advantage of the phenomenon that a recess is generated in the proximity at the edge of the trench isolation in etching back the insulation film. Therefore, it can be manufactured relatively easily by appropriate selection of the manufacturing condition without increasing the number of manufacturing steps.

Furthermore, by employing a structure in which the upper edge corner of the trench has a chamfered tapering configuration of at least 0.05 $\mu$m in width in the diameter direction and not more than 0.05 $\mu$m in depth, or a R configuration having a radius of curvature of at least 0.04 $\mu$m, a structure where the insulation film filling the trench is substantially in flush with the top surface of the main surface of the semiconductor substrate can be applied, satisfying the condition that "the carrier concentration of the active region in the proximity of the trench isolation edge is lower than the carrier concentration at the center of the active region while a predetermined bias voltage is applied to the gate electrode" regardless of whether there is a projection of an insulation film at the main surface of the semiconductor substrate. By employing the above structure, the stepped portion of the surface is not increased. Therefore, the object of the present invention can be achieved without the problems encountered in a stepped portion of the surface in patterning such as in photolithography.

According to the method of manufacturing a semiconductor device including a trench isolation structure of the present invention, the material and thickness of the mask in forming the trench or the conditions of thermal oxidation can be optimized to relax the electric field concentration at the edge of the trench isolation. As a result, a trench isolation structure having the inverse narrow channel effect suppressed can be formed effectively. Selection of the conditions of the manufacturing method of the present invention can be obtained relatively easily by a simulation using an equation of a regression curve.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of optimizing a trench isolation structure provided at a main surface of semiconductor substrate to isolate an active region at the surface of said semiconductor substrate for the purpose of suppressing generation of an inverse narrow channel effect using carrier concentration analysis by simulation, said method comprising:

a first step of generating a model of a device structure that is to be analyzed including a trench isolation structure by process simulation;

a second step of obtaining distribution of carrier concentration in a state with a bias applied by device simulation using said generated model of a device structure;

a third step of calculating difference in carrier concentration between a center portion of said active region and a trench isolation edge from data of the carrier concentration distribution for determining whether an inverse narrow channel effect is generated according to whether the carrier concentration difference is positive or negative; and a fourth step of selecting a trench isolation edge configuration that does not generate an inverse narrow channel effect according to the determination result.

2. The method of optimizing a trench isolation structure according to claim 1, wherein:

said first step comprises a step of setting a plurality of parameters of a cross section configuration of a trench including a trench isolation edge configuration; and said second step comprises a step of altering only one of said plurality of parameters within a predetermined range for obtaining a carrier concentration distribution for various values of said one parameter by device simulation.

3. The method of optimizing a trench isolation structure according to claim 2, wherein said second step further comprises a step of sequentially altering said plurality of parameters other than said one parameter independently for obtaining a carrier concentration distribution calculated by device simulation, wherein a range of a value of said plurality of parameters for suppressing generation of an inverse narrow channel effect is obtained by said third and fourth steps.

4. The method of optimizing a trench isolation structure according to claim 2, wherein said third step comprises a step of expressing parameter dependency of carrier concentration difference between said center portion of said active region and said trench isolation edge on basis of carrier concentration distribution obtained by said second step, using a predetermined regression curve for each of said plurality of parameters, and determining whether an inverse narrow channel effect is generated according to whether a total of carrier concentration difference by an expression of said regression curve expression for each said parameter is positive or negative.

5. The method of optimizing a trench isolation structure according to claim 2, wherein said plurality of parameters include a length (L) and depth (D) of a trench isolation edge, and a height (H) from the main surface of said semiconductor substrate of a portion of an insulator buried in the trench and protruding upwards.

6. The method of optimizing a trench isolation structure according to claim 2, wherein said plurality of parameters include a radius of curvature (R) of a trench isolation edge.

7. The method of optimizing a trench isolation structure according to claim 2, wherein:

the trench isolation has a structure where the upper portion of an isolation film filling the trench is recessed, and said plurality of parameters include a depth (Z) and a position (X) of the recess of said isolation film.

8. The method of optimizing a trench isolation structure according to claim 1, wherein said active region is a p well, and carrier concentration distribution obtained in said second step is electron concentration distribution.

9. The method of optimizing a trench isolation structure according to claim 1, wherein said active region is an n well, and carrier concentration distribution obtained in said second step is hole concentration distribution.

* * * * *